(12) United States Patent
Yoshida et al.

(10) Patent No.: US 11,367,827 B2
(45) Date of Patent: Jun. 21, 2022

(54) PIEZOELECTRIC SUBSTRATE, FORCE SENSOR, AND ACTUATOR

(71) Applicant: Mitsui Chemicals, Inc., Tokyo (JP)

(72) Inventors: Mitsunobu Yoshida, Nagoya (JP); Katsuki Onishi, Nagoya (JP); Kazuhiro Tanimoto, Ichihara (JP)

(73) Assignee: MITSUI CHEMICALS, INC., Tokyo (JP)

( * ) Notice: Subject to any disclaimer, the term of this patent is extended or adjusted under 35 U.S.C. 154(b) by 468 days.

(21) Appl. No.: 16/606,516

(22) PCT Filed: Apr. 20, 2018

(86) PCT No.: PCT/JP2018/016380
§ 371 (c)(1),
(2) Date: Oct. 18, 2019

(87) PCT Pub. No.: WO2018/194180
PCT Pub. Date: Oct. 25, 2018

(65) Prior Publication Data
US 2021/0119106 A1 Apr. 22, 2021

(30) Foreign Application Priority Data
Apr. 20, 2017 (JP) .............................. JP2017-083942

(51) Int. Cl.
*H01L 41/087* (2006.01)
*G01L 1/16* (2006.01)
(Continued)

(52) U.S. Cl.
CPC .............. *H01L 41/087* (2013.01); *G01L 1/16* (2013.01); *H01L 41/09* (2013.01);
(Continued)

(58) Field of Classification Search
CPC .......... G01L 1/16; A42B 3/08; H01L 41/087; H01L 41/09; H01L 41/1132; H01L 41/193
(Continued)

(56) References Cited

U.S. PATENT DOCUMENTS

2012/0025674 A1* 2/2012 Yoshida ................ H01L 41/193
310/365
2012/0132846 A1 5/2012 Yoshida et al.
2018/0108826 A1* 4/2018 Tajitsu .................. H01L 41/047

FOREIGN PATENT DOCUMENTS

JP H10132669 A 5/1998
JP 4934235 B2 5/2012
(Continued)

OTHER PUBLICATIONS

International Search Report (PCT/ISA/210) dated Jul. 3, 2018, by the Japanese Patent Office as the International Searching Authority for International Application No. PCT/JP2018/016380.
(Continued)

*Primary Examiner* — Nathaniel T Woodward
(74) *Attorney, Agent, or Firm* — Buchanan, Ingersoll & Rooney PC

(57) ABSTRACT

A piezoelectric substrate, comprising: a conductor cord that has a core material and a conductor disposed around the core material; and an elongated piezoelectric body that is disposed around the conductor cord in a spiral manner, unidirectionally along an axial direction of the conductor cord, wherein: the piezoelectric body comprises an optically active helical chiral polymer, a lengthwise direction of the piezoelectric body and a main orientation direction of the helical chiral polymer in the piezoelectric body are substantially parallel to each other, the piezoelectric body has an orientation degree F. of from 0.5 to less than 1.0, and the conductor cord satisfies Formula (b): $\Delta D_{max} < t_{pmin}$, wherein $\Delta D_{max}$ is a maximum value of a difference in height between
(Continued)

a division A that is selected from plural divisions and a division B that is adjacent to the division A, and $t_{pmin}$ is a minimum thickness of the piezoelectric body.

20 Claims, 4 Drawing Sheets

(51) Int. Cl.
   *H01L 41/09*     (2006.01)
   *H01L 41/113*    (2006.01)
   *H01L 41/193*    (2006.01)
   *A42B 3/08*      (2006.01)
(52) U.S. Cl.
   CPC ........ *H01L 41/1132* (2013.01); *H01L 41/193* (2013.01); *A42B 3/08* (2013.01)

(58) Field of Classification Search
   USPC .................................................... 73/862.625
   See application file for complete search history.

(56) References Cited

FOREIGN PATENT DOCUMENTS

WO    2010104196 A1    9/2010
WO    2014058077 A1    4/2014

OTHER PUBLICATIONS

Written Opinion (PCT/ISA/237) dated Jul. 3, 2018, by the Japanese Patent Office as the International Searching Authority for International Application No. PCT/JP2018/016380.

* cited by examiner

PIEZOELECTRIC SUBSTRATE, FORCE SENSOR, AND ACTUATOR

TECHNICAL FIELD

The present invention relates to a piezoelectric substrate, a force sensor, and an actuator.

BACKGROUND ART

In recent years, the application of a piezoelectric body including a helical chiral polymer to piezoelectric devices such as sensors and actuators has been studied. In such piezoelectric devices, a piezoelectric body in the form of a film is used.

With regard to the helical chiral polymer in the piezoelectric body, an optically active polymer, such as a polypeptide or a polylactic acid polymer, has been receiving attention. In particular, it is known that polylactic acid polymers express piezoelectric properties only in response to a mechanical stretching operation. It is also known that piezoelectric bodies containing a polylactic acid polymer do not require poling treatment, and that the piezoelectric properties thereof do not deteriorate over the course of several years.

For example, polylactic acid polymer-containing piezoelectric bodies having a large piezoelectric constant ($d_{14}$) and excellent transparency have been reported (see, for example, Patent Documents 1 and 2).

In addition, recently, attempts have been made to utilize a piezoelectric material as a coating of a conductor.

For example, piezo cables that are formed from a central conductor, a piezoelectric material layer, an outer conductor, and an outer cover, which are disposed in a coaxial manner in this order from the center to the outer side, are known (see, for example, Patent Document 3). Patent Document 4 discloses a piezoelectric element obtained by coating conductive fibers with a piezoelectric polymer.

RELATED ART DOCUMENTS

Patent Documents

[Patent Document 1] Japanese Patent No. 4934235
[Patent Document 2] WO 2010/104196
[Patent Document 3] Japanese Patent Application Laid-Open (JP-A) No. H10-132669
[Patent Document 4] WO 2014/058077

SUMMARY OF THE INVENTION

Technical Problem

When a film-form piezoelectric body (e.g., a piezoelectric body described in the Examples of Patent Documents 1 and 2) is used at a location with a significantly irregular configuration or a location that deforms to a significant degree (e.g., when a piezoelectric body is used as a part or the entirety of a wearable product), damages such as breakage and wrinkling may be caused in the piezoelectric body due to deformation, thereby deteriorating the piezoelectric sensitivity (e.g., sensor sensitivity when the piezoelectric body is used as a sensor, or dynamic sensitivity when the piezoelectric body is used as an actuator; the same applies below).

In the piezo cable disclosed in Patent Document 3, polyvinylidene fluoride (PVDF), which is used as a piezoelectric material, may exhibit fluctuations in the piezoelectric constant over time, and reduction in the piezoelectric constant with time. Further, since PVDF is a ferroelectric substance that is pyroelectric, its piezoelectric signal output may fluctuate depending on changes in the ambient temperature. Therefore, the piezo cable disclosed in Patent Document 3 may have insufficient stability in terms of piezoelectric sensitivity and piezoelectric output (stability against changes in time or temperature).

The piezoelectric element disclosed in Patent Document 4 does not specify the direction of winding of the piezoelectric polymer around the conductive fibers. Therefore, even when charges are generated in the piezoelectric polymer due to a shear stress generated therein as a result of tension being applied to the whole piezoelectric element, the polarities of the charges may cancel each other out. As such, the piezoelectric element disclosed in Patent Document 4 may have insufficient piezoelectric sensitivity.

Moreover, when a conductor cord, which has a structure in which a core material is covered with a conductor such as a metal foil and further wrapped with a piezoelectric body, is used as a piezoelectric substrate, a short circuit (shorting) may occur due to contact between the inner conductor and an electroconductive member (outer conductor) disposed outside the piezoelectric substrate.

In view of the above-described circumstances, an object of the invention is to provide: a piezoelectric substrate that exhibits excellent piezoelectric sensitivity and excellent piezoelectric output stability, and that suppresses short-circuiting between an outer conductor and an inner conductor; a force sensor; and an actuator.

Solution to Problem

The means for achieving the above-described object include the following.

<1> A piezoelectric substrate, comprising:
a conductor cord that has a core material and a conductor disposed around the core material; and
an elongated piezoelectric body that is disposed around the conductor cord in a spiral manner, unidirectionally along an axial direction of the conductor cord, wherein:
the piezoelectric body comprises an optically active helical chiral polymer,
a lengthwise direction of the piezoelectric body and a main orientation direction of the helical chiral polymer in the piezoelectric body are substantially parallel to each other,
the piezoelectric body has an orientation degree F. of from 0.5 to less than 1.0, as determined by X-ray diffractometry and Formula (a): $F=(180°-\alpha)/180°$, wherein $\alpha$ represents a half width of a peak derived from orientation, and
when the conductor cord is viewed from a direction perpendicular to an axial direction of the conductor cord, the conductor cord satisfies Formula (b): $\Delta D_{max} < t_{pmin}$, wherein $\Delta D_{max}$ is a maximum value of a difference in height between a division A that is selected from plural divisions and a division B that is adjacent to the division A, and $t_{pmin}$ is a minimum thickness of the piezoelectric body.

<2> The piezoelectric substrate according to <1>, wherein the conductor is disposed around the core material in a spiral manner, unidirectionally along an axial direction of the core material.

<3> The piezoelectric substrate according to <1> or <2>, wherein the core material is a monofilament.

<4> The piezoelectric substrate according to any one of <1> to <3>, wherein the conductor is an inner conductor and the piezoelectric body is disposed around the inner conductor in a spiral manner, unidirectionally along an outer periphery of the inner conductor.

<5> The piezoelectric substrate according to any one of <1> to <4>, further comprising an insulator that is disposed at an outer periphery of the piezoelectric substrate.

<6> The piezoelectric substrate according to any one of <1> to <4>, further comprising an insulator that is disposed between the conductor cord and the piezoelectric body.

<7> The piezoelectric substrate according to any one of <1> to <6>, wherein the piezoelectric body is wound around the conductor cord at an angle of from 15° to 75° with respect to the axial direction of the conductor cord.

<8> The piezoelectric substrate according to any one of <1> to <7>, wherein the piezoelectric body has an elongated flat plate shape.

<9> The piezoelectric substrate according to <8>, wherein the piezoelectric body having the elongated flat plate shape has a thickness of from 0.001 mm to 0.2 mm and a width of from 0.1 mm to 30 mm, and has a ratio of width to thickness of 2 or greater.

<10> The piezoelectric substrate according to any one of <1> to <8>, wherein the piezoelectric body comprises a stabilizer in an amount of from 0.01 parts by mass to 10 parts by mass with respect to 100 parts by mass of the helical chiral polymer, the stabilizer having at least one functional group selected from the group consisting of a carbodiimide group, an epoxy group and an isocyanate group, and having a weight-average molecular weight of from 200 to 60,000.

<11> The piezoelectric substrate according to any one of <1> to <10>, further comprising a functional layer.

<12> The piezoelectric substrate according to <11>, wherein the functional layer is at least one selected from the group consisting of an adhesion promoting layer, a hard coat layer, an antistatic layer, an anti-blocking layer, a protective layer, and an electrode layer.

<13> The piezoelectric substrate according to <11> or <12>, wherein the functional layer comprises an electrode layer.

<14> The piezoelectric substrate according to <13>, wherein the piezoelectric body and the functional layer are configured as a laminate, and at least one surface layer of the laminate is the electrode layer.

<15> The piezoelectric substrate according to any one of <1> to <14>, further comprising an adhesive layer between the conductor cord and the piezoelectric body.

<16> The piezoelectric substrate according to any one of <1> to <15>, wherein the helical chiral polymer in the piezoelectric body is a polylactic acid polymer that has a main chain including a structural unit represented by following Formula (1):

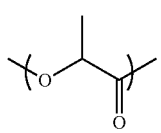

(1)

<17> The piezoelectric substrate according to anyone of <1> to <16>, further comprising an outer conductor disposed at an outer periphery of the piezoelectric substrate.

<18> The piezoelectric substrate according to <17>, further comprising an insulator disposed at an outer periphery of the outer conductor.

<19> A force sensor comprising the piezoelectric substrate according to any one of <1> to <18>.

<20> An actuator comprising the piezoelectric substrate according to any one of <1> to <18>.

Effects of the Invention

According to one mode of the invention, a piezoelectric substrate that exhibits excellent piezoelectric sensitivity and excellent piezoelectric output stability, and that suppresses short-circuiting between an outer conductor and an inner conductor; a force sensor; and an actuator are provided.

DETAILED DESCRIPTION OF THE INVENTION

Mode for Carrying Out the Invention

Figure 1:
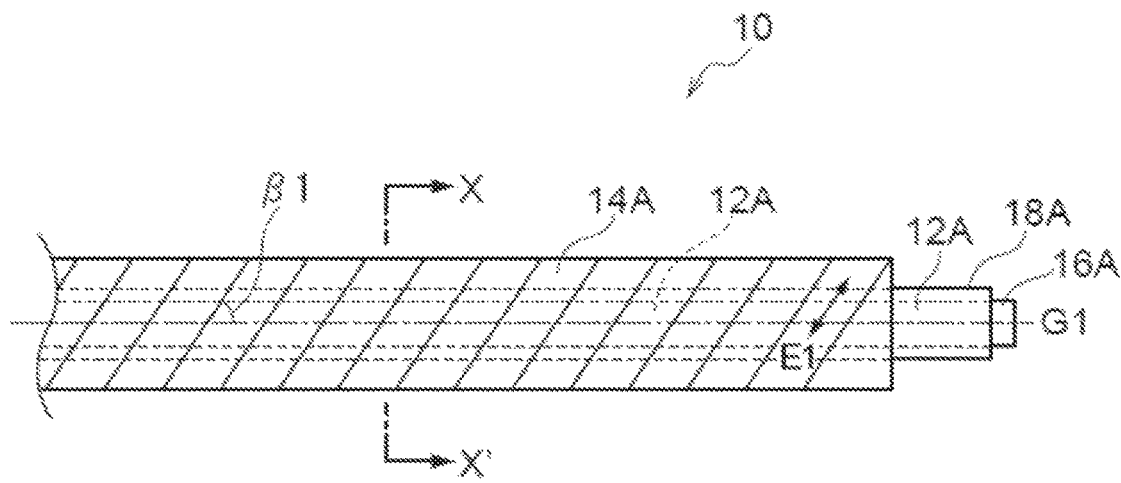
FIG. 1 is a side view illustrating a specific embodiment of a piezoelectric substrate.

In the following, the embodiments of the invention are described. The invention is, however, not restricted to the embodiments.

In the present specification, the numerical range expressed by "from A to B" refers to a range including A and B as a minimum value and maximum value, respectively.

In the present specification, the "main surface" of a piezoelectric body having an elongated flat plate shape refers to a surface that is normal to the thickness direction of the piezoelectric body (in other words, a surface which includes the lengthwise direction and the widthwise direction). The same applies to a "main surface" of a woven fabric and a "main surface" of a knitted fabric.

In the present specification, a "surface" of a member refers to a "main surface" of the member, unless otherwise specified.

In the present specification, a thickness, a width and a length satisfy a relationship of thickness<width<length, according to ordinary definitions.

In the present specification, an angle formed by two line segments is expressed in a range of from 0° to 90°.

In the present specification, the term "film" is a concept that encompasses not only materials that are generally referred to as a "film" but also materials that are generally referred to as a "sheet".

In the present specification, the term "MD direction" refers to a direction in which a film moves (machine direction), namely the stretching direction. The term "TD direction" refers to a direction that is perpendicular to the MD direction and parallel to the main surface of the film (transverse direction).

In the present specification, when an embodiment is described by referring to a drawing, the constitution of the embodiment is not restricted to that illustrated in the drawing. The size of the members in the drawing is conceptual and the relative relationship in size among the members is not restricted to that illustrated in the drawing.

[Piezoelectric Substrate]

The piezoelectric substrate of the present embodiment has a conductor cord that has a core material and a conductor disposed around the core material (hereinafter, simply referred to as a conductor cord), and an elongated piezoelectric body that is disposed around the conductor cord in a spiral manner, unidirectionally along an axial direction of the conductor cord (hereinafter, simply referred to as a piezoelectric body), wherein:

the piezoelectric body comprises an optically active helical chiral polymer;

a lengthwise direction of the piezoelectric body and a main orientation direction of the helical chiral polymer in the piezoelectric body are substantially parallel to each other;

the piezoelectric body has an orientation degree F. of from 0.5 to less than 1.0, as determined by X-ray diffractometry and Formula (a): $F=(180°-\alpha)/180°$, wherein $\alpha$ represents a half width of a peak derived from orientation; and when the conductor cord is viewed from a direction perpendicular to an axial direction of the conductor cord, the conductor cord satisfies Formula (b): $\Delta D_{max} < t_{pmin}$, wherein $\Delta D_{max}$ is a maximum value of a difference in height between a division A that is selected from plural divisions and a division B that is adjacent to the division A, and $t_{pmin}$ is a minimum thickness of the piezoelectric body.

The piezoelectric substrate of the present embodiment, having a structure as described above, exhibits excellent piezoelectric sensitivity as well as excellent piezoelectric output stability. More specifically, first of all, the piezoelectric substrate of the present embodiment exhibits excellent piezoelectric properties, because the piezoelectric body includes a helical chiral polymer, the lengthwise direction of the piezoelectric body and the main orientation direction of the helical chiral polymer are substantially parallel to each other, and the piezoelectric body has an orientation degree F. of from 0.5 to less than 1.0.

Further, the piezoelectric substrate exhibits excellent piezoelectric output stability, because the piezoelectric body is disposed in a spiral manner, unidirectionally along the axial direction of the conductor cord. In other words, since the piezoelectric body is disposed in a spiral manner, when a tension (stress) is applied to the piezoelectric substrate in the lengthwise direction of the piezoelectric substrate, a shear force is applied to the helical chiral polymer in the piezoelectric body, thereby causing polarization of the helical chiral polymer in the radial direction of the piezoelectric substrate. As for the direction of polarization, the piezoelectric body disposed in a spiral manner can be regarded as an aggregate of micro-regions that can be deemed as a plane with respect to the lengthwise direction. When a shear force, attributed to a tension (stress), is applied to the helical chiral polymer in the plane formed by the micro-regions, the direction of polarization substantially coincides with the direction of an electric field generated due to a piezoelectric constant $d_{14}$.

Taking a polylactic acid for example, specifically, in the case of a homopolymer of L-lactic acid having a left-handed helical structure (PLLA), when a tension (stress) is applied to a structure, in which a piezoelectric body whose lengthwise direction is substantially parallel to the main orientation direction of PLLA is disposed around a conductor in a left-handed spiral manner, an electric field is generated (i.e., polarization is caused) in the radial direction of a circular cross-section perpendicular to the tension, from the center toward the outside. Conversely, when a tension (stress) is applied to a structure, in which a piezoelectric body whose lengthwise direction is substantially parallel to the main orientation direction of the PLLA is disposed around a conductor in a right-handed spiral manner, an electric field is generated (i.e., polarization is caused) in the radial direction of the circular cross-section perpendicular to the tension, from the outside toward the center.

Further, for example, in the case of a homopolymer of D-lactic acid having a right-handed helical structure (PDLA), when a tension (stress) is applied to a structure, in which a piezoelectric body whose lengthwise direction is substantially parallel to the main orientation direction of the PDLA is disposed around a conductor in a left-handed spiral manner, an electric field is generated (i.e., polarization is caused) in the radial direction of a circular cross-section perpendicular to the tension, from the outside toward the center. Conversely, when a tension (stress) is applied to a structure in which a piezoelectric body whose lengthwise direction is substantially parallel to the main orientation direction of the PDLA is disposed around a conductor in a right-handed spiral manner, an electric field is generated (i.e., polarization is caused) in the radial direction of the circular cross-section perpendicular to the tension, from the center toward the outside.

As described above, when a tension is applied in the lengthwise direction of the piezoelectric substrate, an electric potential difference that is proportional to the tension is generated with a concordant phase at each portion of the spirally-disposed piezoelectric body. As a result, it is considered that a voltage signal that is proportional to the tension is detected in an effective manner.

Further, as a result of studies conducted by the present inventors, it is found that short-circuiting between the conductor around the core material and an outer conductor is suppressed when the conductor cord satisfies the condition of Formula (b).

The reason why the short-circuiting between the conductor (inner conductor) around the core material and an outer conductor is suppressed when the conductor cord satisfies the condition of Formula (b) is considered to be because it is hard to form a gap between the $n^{th}$ winding and the $(n+1)^{th}$ winding of the piezoelectric body that is disposed around the conductor cord, and therefore, the contact of the conductor cord with the outer conductor is suppressed.

As a result of studies conducted by the present inventors, it is also found that a conductor cord that is produced by winding an electroconductive material around a relatively soft fiber used as a core material, while applying a tension thereto, tends to fail to satisfy the condition of Formula (b), due to periodic knob-like protrusions that are formed at portions at which fibers are slacken or portions that have gradually increased in volume as a result of being squeezed with a conductive material around which short fiber fluffs are tangled.

In addition, it is found that a piezoelectric substrate produced by winding a piezoelectric body around a conductor cord is likely to cause the contact between the conductor cord and an outer conductor, at the gaps formed between adjacent piezoelectric bodies.

In view of the above, in order to produce a piezoelectric substrate that suppresses short-circuiting between an outer conductor and an inner conductor, it is considered to be effective to suppress the formation of irregularities on the surface of the conductor cord, by appropriately selecting the type of the core material such that the conductor cord satisfies the condition of Formula (b). However, a method of obtaining a conductor cord that satisfies the condition of Formula (b) is not restricted thereto.

In the present embodiment, existence or non-existence of a short circuit in the piezoelectric substrate is determined based on a value of resistance between the inner conductor and an outer conductor of the piezoelectric substrate having a length of from 1 cm to 100 m. When the length is less than 1 cm, it tends to be difficult to draw an electrode to electrically connect the piezoelectric substrate to a resistance meter, thereby failing to determine the existence of short circuit.

The term "substantially parallel" used herein refers to that an angle formed by two line segments is from 0° to less than 30 (preferably from 0° to 22.5°, more preferably from 0° to 10°, still more preferably from 0° to 5°, particularly preferably from 0° to 3°).

The feature that the lengthwise direction of the piezoelectric body and the main orientation direction of the helical chiral polymer are substantially parallel to each other is advantageous in that the piezoelectric body has sufficient strength against a tension applied in the lengthwise direction (i.e., having excellent tensile strength in the lengthwise direction). Accordingly, the piezoelectric body is hard to break even when it is disposed around a conductor, in a unidirectional and spiral manner.

In addition, the feature that the lengthwise direction of the piezoelectric body and the main orientation direction of the helical chiral polymer are substantially parallel to each other is also advantageous from the standpoint of productivity, for example, in the case of obtaining a piezoelectric body by slitting a stretched piezoelectric film (e.g., obtaining a piezoelectric body as a slit ribbon).

In the present specification, the "main orientation direction of the helical chiral polymer" refers to the direction in which the majority of helical chiral polymer is oriented. The main orientation direction of the helical chiral polymer can be confirmed by measuring the orientation degree F. of the piezoelectric body.

When the piezoelectric body is produced by performing melt-spinning of a raw material and subsequently stretching the same, the main orientation direction of the helical chiral polymer in the resulting piezoelectric body refers to the main stretching direction. The term "main stretching direction" used herein refers to a direction of performing the stretching.

Similarly, when the piezoelectric body is produced by stretching a film and forming a slit from the stretched film, the main orientation direction of the helical chiral polymer in the resulting piezoelectric body refers to the main stretching direction. In the case of uniaxial stretching, the main stretching direction refers to a direction of performing the stretching. In the case of biaxial stretching, the main stretching direction refers to a direction of performing the stretching at a greater stretching ratio.

The "orientation degree F." of the piezoelectric body refers to an index that indicates a degree of orientation of the helical chiral polymer in the piezoelectric body. For example, the orientation degree F. is a c-axis orientation degree measured by a wide-angle X-ray diffractometer (RINT 2550 manufactured by Rigaku Corporation, attached equipment: rotary sample table, X-ray source: CuKα, output: 40 kV, 370 mA, detector: scintillation counter). One example of a method of measuring the orientation degree F. of the piezoelectric body is described below in the Examples.

The term "unidirectionally along the axial direction" used herein for the core material or the conductor cord refers to a direction in which the conductor or the piezoelectric body is wound from the front side toward the back side of the core material or the conductor cord, when the conductor or the piezoelectric substrate is viewed from one end of the axial direction of the core material or the conductor cord. Specifically, the "unidirectional" refers to a right direction (right-handed winding, i.e., clockwise) or a left direction (left-handed winding, i.e., counterclockwise).

In the following, details of the piezoelectric substrate of the present embodiment are described.

In the piezoelectric substrate of the present embodiment, an elongated piezoelectric body is wound around a conductor cord, in a spiral and unidirectional (right-handed or left-handed) manner along the outer peripheral surface of the conductor cord.

By using the conductor cord, it becomes easier to dispose the piezoelectric body around the conductive cord in a spiral and unidirectional manner while maintaining a certain degree of spiral angle β.

The term "spiral angle β" used herein refers to an angle formed by the axial direction of the conductor cord and the direction in which the piezoelectric body is disposed (the lengthwise direction of the piezoelectric body).

In that case, for example, polarization of the helical chiral polymer tends to occur in the radial direction of the piezoelectric substrate, upon application of a tension along the lengthwise direction of the piezoelectric substrate. As a result, a voltage signal (charge signal) that is proportional to the tension is effectively detected.

In addition, the piezoelectric substrate having the above-described constitution has the same structure as an internal structure (an inner conductor and a dielectric body) of a coaxial cable. Therefore, when the piezoelectric substrate is applied to a coaxial cable, for example, a structure with a high degree of electromagnetic shielding performance and a high degree of noise resistance can be achieved.

From the standpoint of improving the piezoelectric sensitivity and the piezoelectric output stability of the piezoelectric substrate, the piezoelectric body is preferably wound around the conductor cord while maintaining an angle of from 15 to 75 (45°±30°), more preferably at an angle of from 35° to 55° (45°±10°), with respect to the axial direction of the conductor cord.

The piezoelectric body may include a structure in which the piezoelectric body is wound in a right-handed manner with respect to the axial direction of the conductor cord, and a part of the piezoelectric body is wound in a left-handed manner. When a part of the piezoelectric body is wound in a left-handed manner, the ratio of the piezoelectric body that is wound in a left-handed manner is preferably less than 50% with respect to the total piezoelectric body (a total of right-handed winding and left-handed winding), from the standpoint of suppressing a reduction in the piezoelectric sensitivity and obtaining a piezoelectric substrate having stable voltage polarity of piezoelectric output.

The piezoelectric substrate of the present embodiment may include a structure in which the piezoelectric body is wound around the conductor in a left-handed manner, and a part of the piezoelectric body is wound in a right-handed manner. When a part of the piezoelectric body is wound in a right-handed manner, the ratio of the piezoelectric body that is wound in a right-handed manner is preferably less than 50% with respect to the total piezoelectric body (a total of right-handed winding and left-handed winding), from the standpoint of suppressing a reduction in the piezoelectric sensitivity and obtaining a piezoelectric substrate having stable voltage polarity of piezoelectric output.

[Specific Embodiment of Piezoelectric Substrate]

In the following, an exemplary embodiment of the piezoelectric substrate is explained by referring to the drawings.

Figure 2:
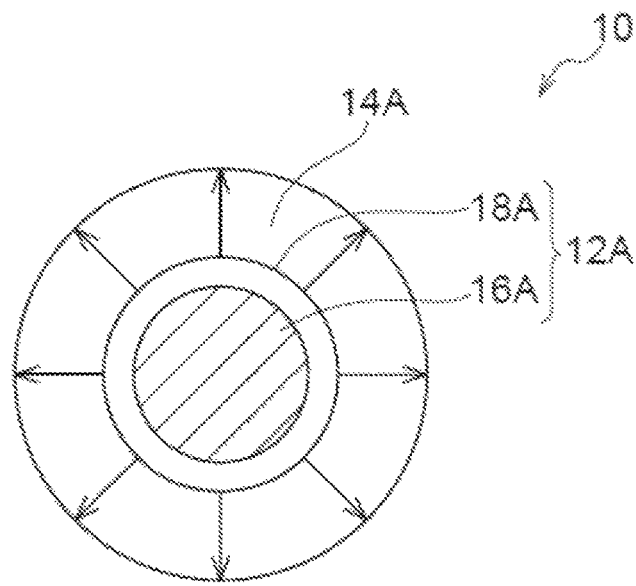
FIG. 2 is a cross-sectional view at the X-X' line of the piezoelectric substrate illustrated in FIG. 1.

FIG. 1 is a side view illustrating a specific mode of the piezoelectric substrate. FIG. 2 is a cross-sectional view at a X-X' line of the piezoelectric substrate shown in FIG. 1.

A piezoelectric substrate 10 includes a conductor cord 12A and a piezoelectric body 14A having an elongated shape.

The conductor cord 12A includes a core material 16A and a conductor 18A that is disposed around the core material 16A.

As illustrated in FIG. 1, the piezoelectric body 14A is disposed in a spiral manner at a spiral angle β1, without a gap, unidirectionally along the outer peripheral surface of the conductor cord 12A from one end to the other end.

The term "spiral angle β1" used herein refers to an angle formed by an axial direction G1 of the conductor cord 12A and the direction in which the piezoelectric body 14A is disposed.

The piezoelectric body 14A is wound around the conductor cord 12A in a left-handed spiral manner. Specifically, when the piezoelectric substrate 10 is viewed from one end of the axial direction of the conductor cord 12A (from the right-end side in the case of FIG. 1), the piezoelectric body 14A is wound around the conductor cord 12A in a left-handed spiral manner, from the front side toward the back side of the conductor cord 12A.

In FIGS. 1 and 2, the main orientation direction of a helical chiral polymer in the piezoelectric body 14A is indicated by a double-headed arrow E1. In other words, the main orientation direction of the helical chiral polymer and the direction in which the piezoelectric body 14A is disposed (the lengthwise direction of the piezoelectric body 14A) are substantially parallel to each other.

The piezoelectric substrate 10 is capable of extracting a charge (electric field), generated by application of a tension in the lengthwise direction, as a voltage signal.

Specifically, when a tension is applied in the lengthwise direction of the piezoelectric substrate 10, a shear force is applied to the helical chiral polymer in the piezoelectric body 14A, and the helical chiral polymer is polarized. It is believed that this polarization of the helical chiral polymer occurs in the radial direction of the piezoelectric substrate 10 as indicated by arrows in FIG. 2, and that the polarization direction is attributed to phase alignment. As a result, a voltage signal that is proportional to the tension is effectively detected.

Figure 3:
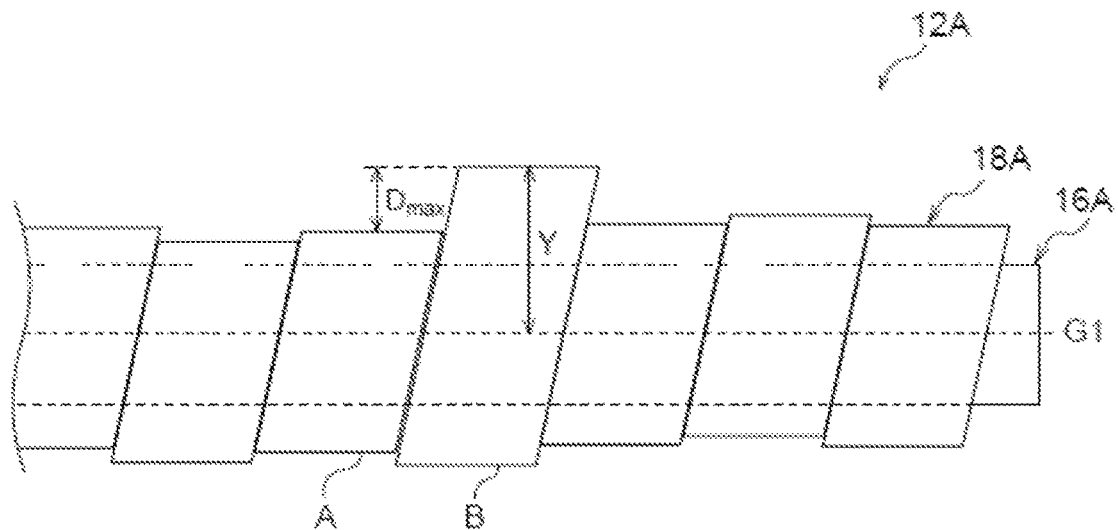
FIG. 3 is a schematic plan view of a conductor cord viewed from a direction perpendicular to the axial direction thereof.

FIG. 3 is a schematic plan view of the conductor cord 12A of the piezoelectric substrate 10 observed from a direction perpendicular to the axial direction. The conductor cord 12A illustrated in FIG. 3 includes the conductor 18A that is disposed around the core material 16A. The conductor 18A is wound around the core material 16A, unidirectionally along the axial direction of the core material 16A.

As such, the conductor that is wound around the core material is observed as plural divisions having a parallelogram shape that are defined from each other.

The term "height" of a division refers to a maximum value Y of a distance between a perpendicular line drawn from a line along the axial direction G1 of the conductor cord 12A and an outline of the division.

The piezoelectric substrate of the present embodiment satisfies a condition of Formula (b): $\Delta D_{max} < t_{pmin}$. In Formula (b), $\Delta D_{max}$ refers to a maximum value of a difference in the height of a division A, having a substantially parallelogram shape that corresponds to the conductor body, and the height of a division B that is adjacent to the division A; and $t_{pmin}$ refers to a minimum thickness of the piezoelectric body. By satisfying the condition of Formula (b), occurrence of a short circuit, which is caused by the contact between the conductor cord and an external electrode at a gap formed in the piezoelectric substrate, can be suppressed.

The method of determining the value of $\Delta D_{max}$ of the piezoelectric substrate is not particularly restricted, and may be determined by any method for observing the conductor cord from a direction perpendicular to the axial direction of the conductor cord. The observation of the conductor cord may be performed either in a state in which the piezoelectric body is not disposed around the conductor, or in a state in which the piezoelectric body is disposed around the conductor.

In the present specification, the "minimum thickness" of the piezoelectric body is defined as the smallest value among the thickness values measured at five arbitrarily selected points. A method of examining the minimum thickness $t_{pmin}$ of the piezoelectric body is not particularly restricted, and the minimum thickness $t_{pmin}$ may be examined by observation in the same manner as the value of $\Delta D_{max}$, or it may be measured from the piezoelectric body that is not disposed around the conductor cord.

[Conductor Cord]

In the piezoelectric substrate, the conductor cord is preferably a signal line conductor. The term "signal line conductor" refers to a conductor for efficiently detecting an electrical signal from the piezoelectric body. More specifically, the signal line conductor is a conductor for detecting a voltage signal (charge signal) corresponding to a tension applied to the piezoelectric substrate.

A specific constitution of the conductor cord is not particularly restricted, as long as the conductor cord includes a core material and a conductor that is disposed around the core material. For example, the conductor cord may have a structure including a core material and a conductor that is disposed in a spiral manner around the core material, unidirectionally along the axial direction of the core material (a conductor cord having such a constitution is also referred to as "tinsel wire"); a structure including a core material and a conductor that is disposed around the core material as a continuous cover; or a structure including a core material and a conductor having a linear shape and forming a braid-like structure along the axial direction of the core material. The conductor cord may have a configuration other than those as well.

The thickness of the conductor that is disposed around the core material is not particularly restricted, and can be selected in accordance with the desired properties of the piezoelectric substrate. For example, the thickness of the conductor (when the thickness is not uniform, the thickness of a portion with the smallest thickness) is preferably from 0.5 μm to 10 mm, more preferably from 1 μm to 5 mm, still more preferably from 5 μm to 3 mm.

The cross-sectional shape of the conductor cord is not particularly restricted. It is preferably a circular or substantially circular shape. More preferably, the cross-sectional shape of the conductor cord has a doughnut shape, a concentric annular shape, or a shape similar to those, formed from a core material and a conductor is positioned around the core material.

In the conductor cord, the ratio of the surface area of the core material that is in contact with the conductor (coverage of the core material with the conductor) is not particularly restricted; however, it is believed that the higher this ratio is, the more effective it is to detect a voltage signal that is proportional to a tension. The coverage of the core material with the conductor is preferably not less than 70%, more preferably not less than 80%, still more preferably not less than 90%.

The length of the conductor cord is not particularly restricted, and can be selected in accordance with the intended use and the like of the piezoelectric substrate. The length of the conductor cord may be, for example, from 1 mm to 10 m, preferably from 5 mm to 5 m, more preferably from 5 mm to 1 m. When the length of the conductor cord is 1 mm or greater, advantages of shaping the conductor into a cord are sufficiently expressed. When the length of the conductor is 10 m or less, a large amount of electrostatic capacity of a coaxial wire is ensured, and problems such as a reduction in voltage output due to a local tension are less likely to occur. The conductor cord may be produced in a continuous manner to be used by cutting into a desired length.

By appropriately selecting the types of the core material and the conductor that constitute the conductor cord, a piezoelectric substrate that is suitable for applications that require a high degree of bendability and a high degree of flexibility (e.g., wearable sensors incorporated into clothes) can be obtained.

Specific examples of the conductor cord include a twisted yarn obtained by twisting a short fiber, and a cord obtained by using a long fiber or the like as a core material and covering this core material with a metal material (e.g., by spirally winding a metal foil or forming a metal coating around the core material). In the case of using a twisted yarn of a short fiber, those with a longer short fiber or those with less fluffing that comes out of the twisted yarn is preferred.

When the conductor cord is produced by winding a metal foil around a core material, the metal foil preferably has a flat wire shape. The metal foil having a flat wire shape can be produced by rolling a metal wire or slitting a metal foil at a small width. By using a metal foil having a flat wire shape, formation of gaps between the metal foil and a piezoelectric body that is disposed around the conductor cord can be reduced, and adhesion of the conductor cord with respect to the piezoelectric body can be improved. As a result, detection of a change in charge generated from the piezoelectric body becomes easier and sensitivity with respect to a tension is further improved.

When the metal foil has a flat wire shape, the ratio of width to thickness at a cross-section (preferably a cross-section having a rectangular shape) is preferably 2 or greater.

The material of the metal foil is not particularly restricted; however, a copper foil is preferred. By using copper, which is highly electroconductive, the output impedance can be reduced. Accordingly, when a tension is applied to the piezoelectric substrate, a voltage signal corresponding to the tension can be detected more easily. As a result, the piezoelectric sensitivity and the piezoelectric output stability tend to be further improved. In addition, since the copper foil stays within an elastic deformation region during bending deformation, and is hard to undergo plastic deformation. Therefore, occurrence of fatigue breakage of the metal is suppressed, and the resistance to repeated bending can thereby be markedly improved.

The conductor cord preferably has excellent resistance against repeated bending, torsion and the like (flexural resistance). When a piezoelectric body is wound around the conductor cord, it is preferred that the conductor cord also has a high degree of bendability and a high degree of rigidity, in order to sufficiently support a tension. As an index thereof, a bending rigidity B per unit length of the conductor cord is preferably not less than $0.1 \times 10^{-4}$ [N·m$^2$/m]. As a method of measuring the bending rigidity B per unit length of the conductor cord, a method using a measuring equipment such as a bending tester (KES-FB2, manufactured by Kato Tech Co., Ltd.) is generally employed.

The bending rigidity per unit length B of the conductor cord is more preferably from $0.1 \times 10^{-4}$ [N·m$^2$/m] to $1,000 \times 10^{-4}$ [N·m$^2$/m], still more preferably from $0.5 \times 10^{-4}$ [N·m$^2$/m] to $100 \times 10^{-4}$ [N·m$^2$/m], particularly preferably from $10 \times 10^{-4}$ [N·m$^2$/m] to $100 \times 10^{-4}$ [N·m$^2$/m].

The core material in the conductor cord functions as a structural material that supports a tension applied to the conductor cord. By appropriately selecting the material, the cross-sectional area and the like of the core material, the core material can be designed in conformity to the values of the tension, strain and the like applied to the conductor cord.

The material of the core material is not particularly restricted, and can be selected in accordance with the desired properties of the piezoelectric substrate. From the standpoint of attaining a high degree of bendability and a high degree of strength, the core material may be, for example, a fiber (filament) such as a natural fiber or a synthetic fiber.

The material of the core material is not particularly restricted. Examples thereof include polyester, polyethylene, nylon, acryl, polypropylene, vinyl chloride, polysulfone, polyether, polyurethane, fluorocarbon, aramid, polyphenylene sulfide, polyether imide, acetate, rayon, cupra, cotton, hemp, silk, and paper.

The thickness of the core material is not particularly restricted, and can be selected in accordance with the desired properties of the piezoelectric substrate. For example, the outer diameter of the core material is preferably in a range of from 0.1 mm to 10 mm. The core material may be a single fiber (monofilament) or a multifilament composed of plural fibers.

[Piezoelectric Body]

In the present embodiment, from the standpoint of improving piezoelectric sensitivity and piezoelectric output stability, it is preferred that the piezoelectric body has an elongated flat-plate shape. By using a piezoelectric body having an elongated flat-plate shape, the area that contacts the conductive cord can be increased, and a charge generated by a piezoelectric effect can be detected as a voltage signal more efficiently.

In the following, the dimensions (thickness, width and ratios (width/thickness, length/width)) of the piezoelectric body having an elongated flat-plate shape (hereinafter, also referred to as "elongated flat plate-shaped piezoelectric body") will now be described in more detail.

The thickness of the elongated flat plate-shaped piezoelectric body is preferably from 0.001 mm to 0.2 mm. When the thickness of the elongated flat plate-shaped piezoelectric body is 0.001 mm or greater, a sufficient strength tends to be ensured. In addition, this piezoelectric body tends to have excellent production suitability. Meanwhile, when the thickness of the elongated flat plate-shaped piezoelectric body is 0.2 mm or less, the deformation freedom (flexibility) in the thickness direction tends to be improved.

The width of the elongated flat plate-shaped piezoelectric body is preferably from 0.1 mm to 30 mm, more preferably from 0.5 mm to 15 mm. When the width of the elongated flat plate-shaped piezoelectric body is 0.1 mm or greater, a sufficient strength tends to be ensured. In addition, the piezoelectric body tends to have excellent production suitability (e.g., production suitability in a slitting process as described below). Meanwhile, when the width of the elongated flat plate-shaped piezoelectric body is 30 mm or less, the deformation freedom (flexibility) tends to be improved.

In the elongated flat plate-shaped piezoelectric body, the ratio of width to thickness (hereinafter, also referred to as "ratio [width/thickness]") is preferably 2 or greater. When the ratio [width/thickness] of the elongated flat plate-shaped piezoelectric body is 2 or greater, it becomes easier to form an electrode layer (e.g., an outer conductor) on the surface of the piezoelectric body along the lengthwise direction thereof, due to the main surface that is clearly defined. For example, an outer conductor can be easily formed on at least one of the main surfaces.

The width of the elongated flat plate-shaped piezoelectric body is more preferably from 0.5 mm to 15 mm. With the width of the elongated flat plate-shaped piezoelectric body being 0.5 mm or greater, the strength of the piezoelectric body tends to be further improved. In addition, since distortion of the elongated flat plate-shaped piezoelectric body is further suppressed, piezoelectric sensitivity and stability of the piezoelectric substrate tend to be further improved. Meanwhile, with the width being 15 mm or less, the deformation freedom (flexibility) of the elongated flat plate-shaped piezoelectric body tends to be further improved.

In the elongated flat plate-shaped piezoelectric body, the ratio of length to width (hereinafter, also referred to as "ratio [length/width]") is preferably 10 or greater. When the ratio [length/width] of the elongated flat plate-shaped piezoelectric body is 10 or greater, the deformation freedom (flexibility) is further improved.

A method of producing the elongated flat plate-shaped piezoelectric body is not particularly restricted, and the elongated flat plate-shaped piezoelectric body can be produced by any known method.

As a method of producing the elongated flat plate-shaped piezoelectric body from a piezoelectric film, for example, the elongated flat plate-shaped piezoelectric body can be obtained by molding a raw material into the form of a film to obtain an unstretched film, stretching and crystallizing the thus obtained unstretched film, and then slitting the resulting piezoelectric film (cutting the piezoelectric film into an elongated shape).

Alternatively, the piezoelectric body may be produced by a known flat-yarn production method. For example, the piezoelectric body can be obtained by slitting a wide film obtained by inflation molding to prepare a narrow film, followed by stretching of this narrow film by hot-plate stretching, roll stretching or the like and crystallization.

Further, the piezoelectric body can also be obtained by stretching and crystallizing a flat monofilament (preferably a flat monofilament having a width-to-thickness ratio of 2 or greater at a cross-section) prepared by melt-spinning using a die having a known modified cross-sectional shape.

It is noted here that the above-described stretching and crystallization may be performed in any order. Further, a method of sequentially subjecting an unstretched film to pre-crystallization, stretching and crystallization (annealing) may be employed as well. The stretching may be uniaxial stretching or biaxial stretching. In the case of biaxial stretching, the stretching ratio in one of the directions (main stretching direction) is preferably set to be greater than the other.

With regard to the method of producing the piezoelectric film, reference can be made to known documents, such as Japanese Patent No. 4934235, WO 2010/104196, WO 2013/054918, and WO 2013/089148.

(Helical Chiral Polymer)

The piezoelectric body contains an optically active helical chiral polymer. The term "optically active helical chiral polymer" used herein refers to a polymer that has a helical molecular structure and exhibits molecular optical activity.

From the standpoint of further improving the piezoelectric properties, the content of the helical chiral polymer in the piezoelectric body is preferably 80% by mass or more with respect to the total piezoelectric body.

Examples of the helical chiral polymer include polypeptides, cellulose derivatives, polylactic acid polymers, polypropylene oxides, and poly(β-hydroxybutyric acid).

Examples of the polypeptides include poly(γ-benzyl glutarate) and poly(γ-methyl glutarate).

Examples of the cellulose derivatives include cellulose acetate and cyanoethyl cellulose.

From the standpoint of improving the piezoelectric properties of the piezoelectric body, the optical purity of the helical chiral polymer is preferably 95.00% ee or more, more preferably 96.00% ee or more, still more preferably 99.00% ee or more, yet still more preferably 99.99% ee or more, desirably 100.00% ee. By controlling the optical purity of the helical chiral polymer to be within the above-described range, it is believed that the packing property of polymer crystals, which exhibit piezoelectric properties, is improved, whereby piezoelectric properties are improved.

The optical purity of the helical chiral polymer is a value calculated by the following equation:

Optical purity (% ee)=100×|L-form amount−D-form amount|/(L-form amount+D-form amount)

That is, the optical purity of the helical chiral polymer is a value obtained by multiplying [a numerical value obtained by dividing "the difference (absolute value) between the amount (% by mass) of the L-form in the helical chiral polymer and the amount (% by mass) of the D-form in the helical chiral polymer" by "a total of the amount (% by mass) of the L-form in the helical chiral polymer and the amount (% by mass) of the D-form in the helical chiral polymer"] by 100.

From the standpoint of further improving the piezoelectric properties, the helical chiral polymer in the piezoelectric body is preferably composed of either one of D-form or L-form.

As the amount of the L-form in the helical chiral polymer [% by mass] and the amount of the D-form in the helical chiral polymer [% by mass], values obtained by a method using high-performance liquid chromatography (HPLC) are used. The details of the measurement are specifically described below.

From the standpoint of improving the optical purity and the piezoelectric properties, the helical chiral polymer is preferably a polymer that has a main chain including a structural unit represented by the following Formula (1).

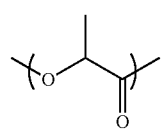
(1)

Examples of a polymer having the structural unit represented by Formula (1) as a main chain include polylactic acid polymers.

The term "polylactic acid polymer" used herein encompasses (1) polylactic acids (polymers consisting only of structural units derived from a monomer selected from L-lactic acid and D-lactic acid); (2) copolymers of L-lactic acid or D-lactic acid and a compound that is copolymerizable with the L-lactic acid or D-lactic acid; and (3) mixtures of (1) and (2).

Among the polylactic acid polymers, a polylactic acid is preferred, and a homopolymer of L-lactic acid (PLLA, hereinafter also simply referred to as "L-form") or a homopolymer of D-lactic acid (PDLA, hereinafter also simply referred to as "D-form") is more preferred.

A polylactic acid is a polymer in which lactic acid is polymerized via ester bonds to form a long chain. It is known that a polylactic acid can be produced by, for example, a lactide method involving lactide, or a direct polymerization method in which lactic acid is heated in a solvent under reduced pressure, and polymerized while removing water.

Examples of such a polylactic acid include homopolymers of L-lactic acid, homopolymers of D-lactic acid, block copolymers containing a polymer of at least one of L-lactic acid and D-lactic acid, and graft copolymers containing a polymer of at least one of L-lactic acid and D-lactic acid.

Examples of the "compound that is copolymerizable with L-lactic acid or D-lactic acid" described in the above (2) include hydroxycarboxylic acids, such as glycolic acid, dimethyl glycolic acid, 3-hydroxybutyric acid, 4-hydroxybutyric acid, 2-hydroxypropanoic acid, 3-hydroxypropanoic acid, 2-hydroxyvaleric acid, 3-hydroxyvaleric acid, 4-hydroxyvaleric acid, 5-hydroxyvaleric acid, 2-hydroxycaproic acid, 3-hydroxycaproic acid, 4-hydroxycaproic acid, 5-hydroxycaproic acid, 6-hydroxycaproic acid, 6-hydroxymethylcaproic acid, and mandelic acid; cyclic esters, such as glycolide, β-methyl-δ-valerolactone, γ-valerolactone, and ε-caprolactone; polycarboxylic acids, such as oxalic acid, malonic acid, succinic acid, glutaric acid, adipic acid, pimelic acid, azelaic acid, sebacic acid, undecanedioic acid, dodecanedioic acid and terephthalic acid, and anhydrides of these polycarboxylic acids; polyhydric alcohols, such as ethylene glycol, diethylene glycol, triethylene glycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentyl glycol, tetramethylene glycol, and 1,4-hexanedimethanol; polysaccharides, such as cellulose; and aminocarboxylic acids, such as α-amino acids.

Examples of the "copolymer of L-lactic acid or D-lactic acid and a compound that is copolymerizable with L-lactic acid or D-lactic acid" include block copolymers and graft copolymers having a polylactic acid sequence capable of yielding a helical crystal.

In the helical chiral polymer, the concentration of a structure derived from a copolymer component is preferably 20% by mole or less.

For example, when the helical chiral polymer is a polylactic acid polymer, the concentration of the structure derived from a compound that is copolymerizable with lactic acid (copolymer component) in the polylactic acid polymer is preferably 20% by mole or less with respect to a total number of moles of a structure derived from the lactic acid and a structure derived from the copolymer component.

The polylactic acid polymer can be produced by, for example, a method of obtaining a polylactic acid polymer by direct dehydration-condensation of lactic acid as described in JP-A Nos. S59-096123 and H7-033861, or a method of obtaining a polylactic acid polymer by ring-opening polymerization of lactide, which is a cyclic dimer of lactic acid, as described in U.S. Pat. Nos. 2,668,182, 4,057,357 and the like.

Further, in order to allow the polylactic acid polymer obtained by any of the above-described production methods to have an optical purity of 95.00% ee or more, for example, when a polylactic acid is produced by a lactide method, it is preferred to polymerize a lactide whose optical purity has been improved to 95.00% ee or more by a crystallization operation.

Weight-Average Molecular Weight

The weight-average molecular weight (Mw) of the helical chiral polymer is preferably from 50,000 to 1,000,000. By controlling the Mw of the helical chiral polymer to be 50,000 or higher, the mechanical strength of the piezoelectric body is improved. The Mw is more preferably 100,000 or higher, still more preferably 200,000 or higher. Meanwhile, by controlling the Mw of the helical chiral polymer to be 1,000,000 or less, moldability during a process of obtaining the piezoelectric body (e.g., extrusion molding or melt spinning) is improved. The Mw is more preferably 800,000 or less, still more preferably 300,000 or less.

Further, from the standpoint of the strength of the piezoelectric body, the molecular weight distribution (Mw/Mn) of the helical chiral polymer is preferably from 1.1 to 5, more preferably from 1.2 to 4, still more preferably from 1.4 to 3.

In the present specification, the weight-average molecular weight (Mw) and the molecular weight distribution (Mw/Mn) of the helical chiral polymer refer to values determined by gel permeation chromatography (GPC). It is noted here that the Mn is the number-average molecular weight of the helical chiral polymer.

One example of a method of measuring the Mw and the Mw/Mn of the helical chiral polymer by GPC is described below.

GPC Measuring Apparatus: GPC-100, manufactured by Waters Corp.

Column: SHODEX LF-804, manufactured by Showa Denko K.K.

Sample Preparation: The piezoelectric body is dissolved in a solvent (e.g., chloroform) at 40° C. to prepare a sample solution having a concentration of 1 mg/ml.

Measurement Conditions: The sample solution in an amount of 0.1 ml is introduced to a column at a temperature of 40° C. and a flow rate of 1 ml/min with a solvent (e.g., chloroform).

The sample concentration in the sample solution separated by the column is measured with a differential refractometer.

A universal calibration curve is prepared using a polystyrene standard sample, and the weight-average molecular weight (Mw) and the molecular weight distribution (Mw/Mn) of the helical chiral polymer are determined.

As a polylactic acid polymer, an example of the helical chiral polymer, a commercially available polylactic acid can be used.

Examples of the commercially available polylactic acid include PURASORB (PD, PL) manufactured by Purac Inc., LACEA (H-100, H-400) manufactured by Mitsui Chemicals, Inc., and INGEO™ BIOPOLYMER manufactured by NatureWorks LLC.

When a polylactic acid polymer is used as the helical chiral polymer, it is preferred to produce the polylactic acid polymer by a lactide method or a direct polymerization method so as to allow the polylactic acid polymer to have a weight-average molecular weight (Mw) of 50,000 or higher.

The piezoelectric body may contain only one type of the above-described helical chiral polymer, or two or more types of the helical chiral polymers.

The content of the helical chiral polymer (total content when two or more types of the helical chiral polymers are incorporated) in the piezoelectric body of the present embodiment is preferably 80% by mass or more with respect to the total amount of the piezoelectric body.

<Stabilizer>

The piezoelectric body may include a stabilizer. The stabilizer preferably include a stabilizer having at least one functional group selected from the group consisting of a carbodiimide group, an epoxy group and an isocyanate group in one molecule, and having a weight-average molecular weight of from 200 to 60,000 (hereinafter, also referred to as a "specific stabilizer"). By including a specific stabilizer, resistance to moisture and heat can be further improved.

As the specific stabilizer, for example, a stabilizer described in the paragraphs [0039] to [0055] of WO 2013/054918 can be used.

Examples of a compound having a carbodiimide group in one molecule (carbodiimide compound) that can be used as a specific stabilizer include monocarbodiimide compounds, polycarbodiimide compounds, and cyclic carbodiimide compounds.

As the monocarbodiimide compounds, for example, dicyclohexylcarbodiimide and bis-2,6-diisopropylphenylcarbodiimide are suitable.

As the polycarbodiimide compounds, those which are produced by various methods, such as those produced by a conventional polycarbodiimide production method (e.g., the method disclosed in U.S. Pat. No. 2,941,956, Japanese Patent Publication (JP-B) No. S47-33279, J. Org. Chem. 28, 2069-2075 (1963), or Chemical Review 1981, Vol. 81, No. 4, p. 619-621), can be used. Specifically, a carbodiimide compound described in Japanese Patent No. 4084953 can be used as well.

Examples of such polycarbodiimide compounds include poly(4,4'-dicyclohexylmethanecarbodiimide), poly(N,N'-di-2,6-diisopropylphenylcarbodiimide), and poly(1,3,5-triisopropylphenylene-2,4-carbodiimide).

The cyclic carbodiimide compounds can be synthesized in accordance with the method described in JP-A No. 2011-256337 and the like.

As the carbodiimide compound, a commercially available carbodiimide compound may be used, and examples thereof include B2756 (trade name) manufactured by Tokyo Chemical Industry Co., Ltd.; CARBODILITE LA-1 (trade name) manufactured by Nisshinbo Chemical Inc.; and STABAXOL P, STABAXOL P400 and STABAXOL I (all of which are trade names), which are manufactured by Rhein Chemie Rheinau GmbH.

Examples of a compound having an isocyanate group in one molecule (isocyanate compound) that can be used as a specific stabilizer include 3-(triethoxysilyl)propyl isocyanate, 2,4-tolylene diisocyanate, 2,6-tolylene diisocyanate, m-phenylene diisocyanate, p-phenylene diisocyanate, 4,4'-diphenylmethane diisocyanate, 2,4'-diphenylmethane diisocyanate, 2,2'-diphenylmethane diisocyanate, xylylene diisocyanate, hydrogenated xylylene diisocyanate, and isophorone diisocyanate.

Examples of a compound having an epoxy group in one molecule (epoxy compound) that can be used as a specific stabilizer include phenylglycidyl ether, diethylene glycol diglycidyl ether, bisphenol A-diglycidyl ether, hydrogenated bisphenol A-diglycidyl ether, phenol novolac-type epoxy resins, cresol novolac-type epoxy resins, and epoxidized polybutadienes.

The specific stabilizer has a weight-average molecular weight of from 200 to 60,000 as described above, and the weight-average molecular weight is preferably from 200 to 30,000, more preferably from 300 to 18,000. The specific stabilizer having a molecular weight in this range moves more easily, and exhibits an effect of improving the resistance to moisture and heat resistance more effectively.

The weight-average molecular weight of the specific stabilizer is particularly preferably from 200 to 900. The weight-average molecular weight of from 200 to 900 substantially coincides with the number-average molecular weight of from 200 to 900. When the weight-average molecular weight is from 200 to 900, there is a case in which the molecular weight distribution is 1.0. In that case, the "weight-average molecular weight of from 200 to 900" can be simply referred to as the "molecular weight of from 200 to 900".

When the piezoelectric body includes a specific stabilizer, the piezoelectric body may include only one type of the specific stabilizer, or may include two or more types thereof.

When the piezoelectric body includes a specific stabilizer, the content of the specific stabilizer is preferably from 0.01 parts by mass to 10 parts by mass, more preferably from 0.01 parts by mass to 5 parts by mass, still more preferably from 0.1 parts by mass to 3 parts by mass, particularly preferably from 0.5 parts by mass to 2 parts by mass, with respect to 100 parts by mass of the helical chiral polymer.

When the content is 0.01 parts by mass or more, the resistance to moisture and heat tends to be further improved. When the content is 10 parts by mass or less, reduction in transparency tends to be further inhibited.

One example of preferred embodiments of the specific stabilizer is a combination of a stabilizer (B1), having at least one functional group selected from the group consisting of a carbodiimide group, an epoxy group and an isocyanate group, and having a number-average molecular weight of from 200 to 900; and a stabilizer (B2), having two or more functional groups selected from the group consisting of a carbodiimide group, an epoxy group and an isocyanate group in one molecule and has a weight-average molecular weight of from 1,000 to 60,000, are used in combination. The weight-average molecular weight of the stabilizer (B1) having a number-average molecular weight of from 200 to 900 is approximately from 200 to 900, i.e., the number-average molecular weight and the weight-average molecular weight of the stabilizer (B1) are substantially the same value.

When the stabilizer (B1) and the stabilizer (B2) are used in combination as the specific stabilizer, it is preferred that the amount of the stabilizer (B1) is greater than the amount of the stabilizer (B2), from the standpoint of improving the transparency.

Specifically, from the standpoint of satisfying both transparency and resistance to moisture and heat, the amount of the stabilizer (B2) is preferably in a range of from 10 parts by mass to 150 parts by mass, more preferably in a range of from 50 parts by mass to 100 parts by mass, with respect to 100 parts by mass of the stabilizer (B1).

Specific examples of the specific stabilizer (stabilizers B-1 to B-3) are shown below.

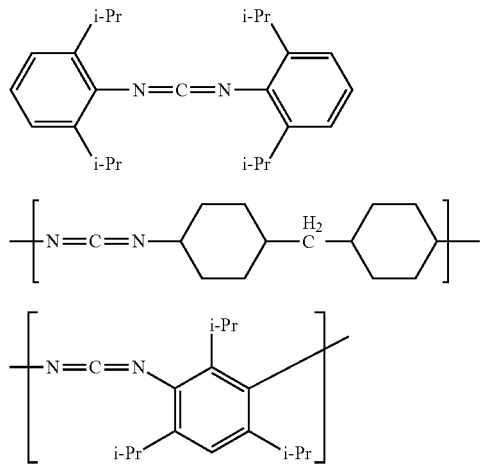

The compound names, commercially available products and the like of the stabilizers B-1 to B-3 are shown below.

Stabilizer B-1: bis-2,6-diisopropylphenylcarbodiimide, having a weight-average molecular weight (in this case, equivalent to a "molecular weight") of 363. Examples of commercially available products include "STABAXOL I" manufactured by Rhein Chemie Rheinau GmbH, and "B2756" manufactured by Tokyo Chemical Industry Co., Ltd.

Stabilizer B-2: poly(4,4'-dicyclohexylmethanecarbodiimide). Examples of commercially available products having a weight-average molecular weight of approximately 2,000 include "CARBODILITE LA-1" manufactured by Nisshinbo Chemical Inc.

Stabilizer B-3: poly(1,3,5-triisopropylphenylene-2,4-carbodiimide). Examples of commercially available products having a weight-average molecular weight of approximately 3,000 include "STABAXOL P" manufactured by Rhein Chemie Rheinau GmbH, and examples of commercially available products having a weight-average molecular weight of 20,000 include "STABAXOL P400" manufactured by Rhein Chemie Rheinau GmbH.

(Other Components)

The piezoelectric body may also include other component(s) as required.

Examples of other components include known resins, such as polyvinylidene fluoride, polyethylene resins, and polystyrene resins; known inorganic fillers, such as silica, hydroxyapatite, and montmorillonite; known crystal nucleating agents, such as phthalocyanine; and stabilizers other than the specific stabilizer. Examples of the inorganic fillers and the crystal nucleating agents also include components described in paragraphs [0057] and [0058] of WO 2013/054918.

(Orientation Degree F.)

As described above, the piezoelectric body of the present embodiment has an orientation degree F. of from 0.5 to less than 1.0, preferably from 0.7 to less than 1.0, more preferably from 0.8 to less than 1.0. When the orientation degree F. of the piezoelectric body is 0.5 or greater, a large number of molecular chains (e.g., polylactic acid molecular chains) of the helical chiral polymer are aligned along the stretching direction. As a result, the rate of generation of oriented crystals is increased, and the piezoelectric body tends to exhibit superior piezoelectric properties. When the orientation degree F. of the piezoelectric body is less than 1.0, the longitudinal tear strength tends to be improved.

(Crystallinity)

The crystallinity of the piezoelectric body of the present embodiment is a value determined by the above-described X-ray diffractometry (wide-angle X-ray diffractometry). The crystallinity of the piezoelectric body is preferably from 20% to 80%, more preferably from 25% to 70%, still more preferably from 30% to 60%.

When the crystallinity is 20% or higher, the piezoelectric properties tend to be maintained at a high level.

When the crystallinity is 80% or less, the piezoelectric body tends to maintain a high degree of transparency. In addition, for example, the piezoelectric body can be easily produced since occurrence of whitening or breakage is suppressed during the production of a piezoelectric film, a raw material for the piezoelectric body, by stretching the same. Moreover, for example, the piezoelectric body can be easily produced since a fiber that is highly bendable and flexible is obtained in the production of a raw material (e.g., polylactic acid) for the piezoelectric body by melt-spinning and subsequent stretching.

(Transparency (Internal Haze))

In the present embodiment, the piezoelectric body may be transparent, although transparency is not necessarily required.

The transparency of the piezoelectric body can be evaluated by measuring the internal haze. The "internal haze" of the piezoelectric body refers to a haze from which a haze attributed to a shape of the outer surface of the piezoelectric body is excluded.

In the case in which transparency is required, the piezoelectric body preferably has an internal haze with respect to visible light of 5% or less, from the standpoint of further improving the transparency and the longitudinal tear strength, the internal haze is more preferably 2.0% or less, still more preferably 1.0% or less. Although the lower limit of the internal haze of the piezoelectric body is not particularly restricted, the lower limit may be, for example, 0.01%.

The internal haze of the piezoelectric body is a value measured in accordance with JIS K7105:1981 with a haze meter (TC-HIII DPK, manufactured by Tokyo Denshoku Co., Ltd.) at 25° C., using a piezoelectric body having a thickness of from 0.03 mm to 0.05 mm. One example of a method of measuring the internal haze of the piezoelectric body is described below.

Sample 1 is prepared by sandwiching only a silicone oil (SHIN-ETSU SILICONE (trademark) manufactured by Shin-Etsu Chemical Co., Ltd., KF96-100CS) between two glass plates. Then, a haze of sample 1 in the thickness direction (hereinafter, referred to as "haze (H2)") is measured.

Sample 2 is prepared by sandwiching plural piezoelectric bodies, which are uniformly wetted with a silicone oil and arranged without a gap, between two glass plates. Then, a haze of sample 2 in the thickness direction (hereinafter, referred to as "haze (H3)") is measured.

The internal haze (H1) of the piezoelectric bodies is determined as a difference between the measured haze values, by the following equation:

Internal haze($H1$)=Haze($H3$)−Haze($H2$)

The haze (H2) and the haze (H3) are measured with the following apparatus under the following measurement conditions, respectively.

Measuring apparatus: HAZE METER TC-HIII DPK, manufactured by Tokyo Denshoku Co., Ltd.

Sample size: 30 mm (width)×30 mm (length)

Measurement conditions: in compliance with JIS K7105: 1981

Measurement temperature: room temperature (25° C.)

[Functional Layer]

The piezoelectric substrate may also include a functional layer, as required. The type of the functional layer is not particularly restricted, and can be selected in accordance with the intended use. For example, the piezoelectric substrate preferably includes at least one of an adhesive layer, a hard coat layer, an antistatic layer, an anti-blocking layer, a protective layer, and an electrode layer. By providing the piezoelectric substrate with a functional layer, the piezoelectric substrate can be applied to, for example, piezoelectric devices, force sensors, actuators, and biological information acquisition devices, more easily. The piezoelectric substrate may include only one functional layer or two or more functional layers. When the piezoelectric substrate includes two or more functional layers, the type of the functional layers may be different from each other.

When the piezoelectric substrate has a functional layer, the functional layer may be disposed on at least one main surface of the piezoelectric body. In the case in which a functional layer is disposed on both of the main surfaces of the piezoelectric body, the type of the functional layers may be the same or different from each other.

Although the thickness of a functional layer is not particularly restricted, it is preferably in a range of from 0.01 μm to 10 μm. The upper limit of the thickness is more preferably 6 μm or less, still more preferably 3 μm or less, while the lower limit is more preferably 0.01 μm or more, still more preferably 0.02 μm or more. When the piezoelectric substrate has plural functional layers, the above-described thickness represents the total thickness of the functional layers.

The piezoelectric substrate preferably has an electrode layer as a functional layer. By providing an electrode layer to the piezoelectric substrate, for example, when the piezoelectric substrate is used as a component of a piezoelectric device (e.g., a piezoelectric woven fabric or a piezoelectric knitted fabric), a force sensor, an actuator or a biological information acquisition device, connection of the piezoelectric substrate to an outer conductor can be performed in a simpler manner. As a result, when a tension is applied to the piezoelectric substrate, a voltage signal corresponding to the tension can be detected more easily.

One exemplary embodiment of the piezoelectric substrate having a functional layer is a laminate in which a functional layer is disposed on at least one surface of the piezoelectric body. In this case, it is preferred that at least one of the surface layers of the laminate is an electrode layer.

The piezoelectric substrate preferably has an adhesive layer between the conductor cord and the piezoelectric body. By providing an adhesive layer to the piezoelectric body, the relative positional relationship of the conductor cord and the piezoelectric body becomes less likely to change. In that case, a tension is applied to the piezoelectric body more easily, and a shear stress is more likely to be applied to the helical chiral polymer in the piezoelectric body. As a result, a voltage output that is proportional to the tension can be effectively detected from the conductor (preferably a signal line conductor). In addition, by providing an adhesive layer, the absolute value of the amount of generated charge per unit tensile force tends to be further increased. The term "adhesion" used herein is a concept that encompasses the "pressure-sensitive adhesion", and the term "adhesive layer" used herein is a concept that encompasses the "pressure-adhesive layer".

The material of an adhesive that forms the adhesive layer is not particularly restricted. Examples of the adhesive that can be used include epoxy-based adhesives, urethane-based adhesives, vinyl acetate resin-based emulsion-type adhesives, EVA-based emulsion-type adhesives, acryl resin-based emulsion-type adhesives, styrene-butadiene rubber-based latex-type adhesives, silicone resin-based adhesives, α-olefin (isobutene-maleic anhydride resin)-based adhesives, vinyl chloride resin-based solvent-type adhesives, rubber-based adhesives, elastic adhesives, chloroprene rubber-based solvent-type adhesives, nitrile rubber-based solvent-type adhesives, and cyanoacrylate-based adhesives.

The elastic modulus of the adhesive layer is preferably equivalent to or higher than the elastic modulus of the piezoelectric body. In this case, a strain (piezoelectric strain) caused by a tension applied to the piezoelectric substrate is hard to be relieved by the adhesive layer, and transmission efficiency of the strain to the piezoelectric body is likely to be maintained. Therefore, when the piezoelectric substrate is applied to a sensor, for example, sensitivity of the sensor is favorably maintained.

The thickness of the adhesive layer is preferably as small as possible, as long as a space is not formed between the piezoelectric substrate and the piezoelectric body and the bonding strength does not decrease. By reducing the thickness of the bonding site, a strain caused by a tension applied to the piezoelectric substrate becomes harder to be relieved by the adhesive portion, and transmission efficiency of the strain to the piezoelectric body is likely to be maintained. Therefore, when the piezoelectric substrate is applied to a sensor, for example, sensitivity of the sensor is favorably maintained.

[Outer Conductor]

The piezoelectric substrate may also have an outer conductor, as required. By providing the piezoelectric substrate with an outer conductor, the piezoelectric substrate can be electrostatically shielded, and a change in voltage of the conductor (preferably an inner conductor), which is caused by external static electricity, can be suppressed.

When the piezoelectric substrate includes an outer conductor, the outer conductor is preferably a ground conductor. The "ground conductor" refers to, for example, a conductor that is paired with another conductor (preferably a signal line conductor) upon signal detection.

The material of the outer conductor is not particularly restricted, and examples thereof mainly include the following materials, depending on the shape of a cross section.

As the material of a ground conductor having a rectangular cross-section, a copper foil ribbon obtained by rolling and processing a copper wire having a circular cross-section into a flat plate form, an Al foil ribbon or the like can be used.

As the material of a ground conductor having a circular cross-section, a copper wire, an aluminum wire, an SUS wire, a metal wire having an insulating coating, a carbon fiber, a resin fiber integrated with a carbon fiber, or a tinsel wire obtained by winding a copper foil around a fiber in a spiral manner.

It is also possible to use an organic electroconductive material coated with an insulating material as an outer conductor.

The outer conductor may have any cross-sectional shape, such as a circular shape, an elliptical shape, a rectangular shape or an irregular shape. In particular, when the outer conductor has a rectangular cross-section, with a large surface area to contact an adherend, a charge generated by a piezoelectric effect can be efficiently detected as a voltage signal.

The outer conductor is preferably disposed to wraparound the piezoelectric substrate, so as not to cause short circuit between the outer conductor and the conductor cord inside the piezoelectric substrate. The method of wrapping the piezoelectric substrate with an outer conductor may be a method of spirally winding a copper foil or the like around the piezoelectric substrate, or a method of processing a copper wire or the like into a cylindrical braid and then wrapping the piezoelectric substrate in this braid, but the method is not restricted to these methods.

One of the preferred embodiments is that the outer conductor having a cylindrical shape is disposed around a minimum basic structural unit of a piezoelectric substrate (i.e., conductor cord and piezoelectric body). Another one of the preferred embodiments is that an outer conductor having a planar or sheet shape is disposed in the vicinity of one or both sides of a piezoelectric substrate that has been processed into a sheet-like shape, such as a piezoelectric knitted fabric or a piezoelectric woven fabric as described later.

[Insulator]

The piezoelectric substrate may have an insulator, as required. By providing the piezoelectric substrate with an insulator, the piezoelectric substrate can be electrically shielded, and a change in voltage of a conductor (preferably an inner conductor) caused by external static electricity can be suppressed. As a result, when the piezoelectric substrate is used as a component of a piezoelectric device (e.g., a piezoelectric woven fabric or a piezoelectric knitted fabric), a force sensor, an actuator or a biological information acquisition device, stable output that is hard to change in sensitivity, and robust against various environmental fluctuations, is expected to be attained.

the position of the insulator with respect to the piezoelectric substrate is not particularly restricted, and can be selected depending on the applications thereof. For example, the insulator may be disposed between the conductor cord and the piezoelectric body of the piezoelectric substrate, between the piezoelectric substrate and the outer conductor, or on the outer periphery of the outer conductor.

The insulator may have, for example, an elongated shape, and may be in a state of being wound around the conductor cord, the piezoelectric substrate or the outer conductor.

the material of the insulator is not particularly restricted. Examples thereof include vinyl chloride resins, polyethylene resins, polypropylene resins, ethylene-tetrafluoroethylene copolymers (ETFE), tetrafluoroethylene-hexafluoropropylene copolymers (FEP), tetrafluoroethylene resins (PTFE), tetrafluoroethylene-perfluoropropylvinyl ether copolymers (PFA), fluororubbers, polyester resins, polyimide resins, polyamide resins, polyethylene terephthalate resins (PET), and rubbers (including elastomers).

<Usage Embodiments of Piezoelectric Substrate>

In the piezoelectric substrate of the present embodiment, when a tensile force is applied, a shearing strain that is proportional to the tensile force is applied to the helical chiral polymer, and this shearing strain is detected as a voltage signal (charge signal) from the conductor. There are various methods of applying a tensile force to the piezoelectric substrate, such as applying a tension to the piezoelectric substrate in a direct manner, or in a manner as illustrated in FIGS. 5 and 6.

Figure 5:
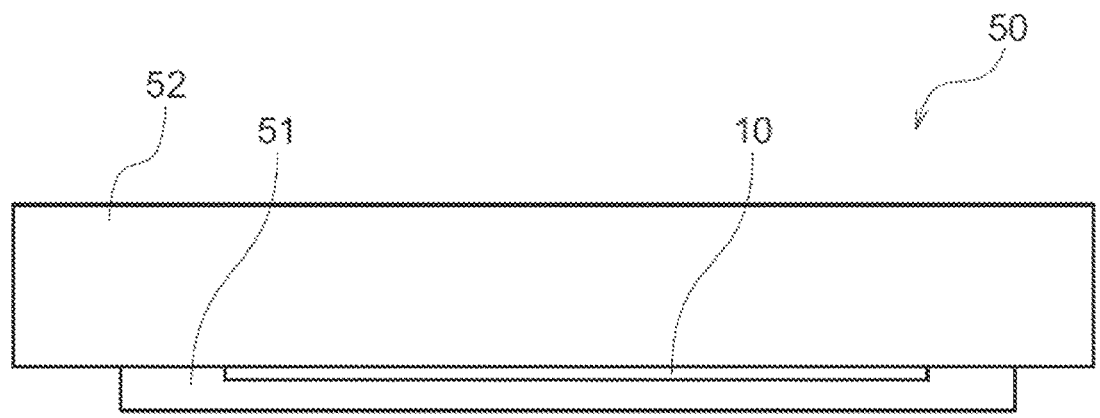
FIG. 5 is a schematic cross-sectional view of a piezoelectric substrate that is attached with a flat plate with an adhesive tape.
Figure 6:
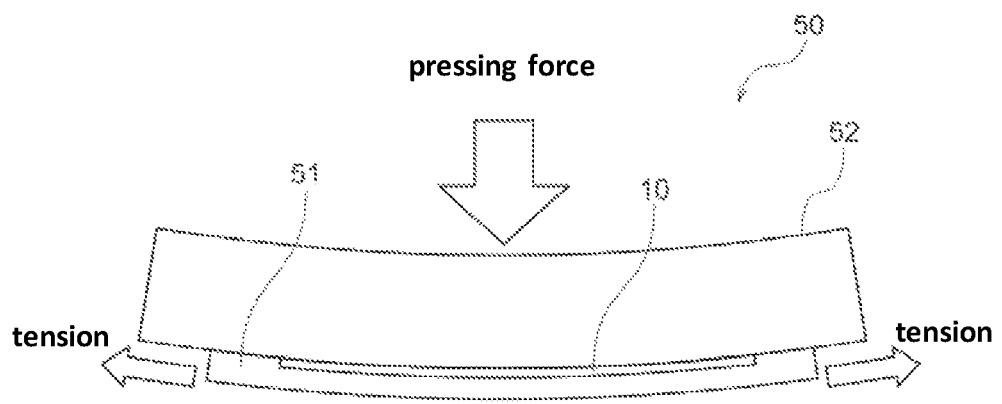
FIG. 6 is a schematic cross-sectional view of a piezoelectric substrate that is attached with a flat plate with an adhesive and pressure is applied thereto.

In FIGS. 5 and 6, a piezoelectric substrate 10 is attached to a flat plate 52 with an adhesive tape 51 to prepare a flat plate-equipped piezoelectric substrate 50. A pressing force is applied to the flat plate 52, and a tension is applied to the piezoelectric substrate 10 due to deformation of the flat plate 52 caused by bending, thereby detecting a voltage signal.

FIG. 5 is a schematic cross-sectional view illustrating the piezoelectric substrate 10 to which the flat plate 52 is attached with the adhesive tape 51 (flat plate-equipped piezoelectric substrate 50). FIG. 6 is a schematic cross-sectional view illustrating a state of being applied with a pressure of the piezoelectric substrate 10 to which the flat plate 52 is attached with the adhesive tape 51 (flat plate-equipped piezoelectric substrate 50).

There are various methods for mechanically integrating the piezoelectric substrate 10 and the flat plate 52 by attaching the piezoelectric substrate 10 to the flat plate 52. For example, in FIG. 7, a part of the piezoelectric substrate 10 is attached to the flat plate 52 using the adhesive tape 51 such as a cellophane tape or a duct tape. In FIG. 8, a part of the piezoelectric substrate 10 is attached to the flat plate 52 using an adhesive 61 such as a thermosetting adhesive (e.g., an epoxy resin) or a thermoplastic adhesive (e.g., a hot-melt adhesive).

Figure 7:
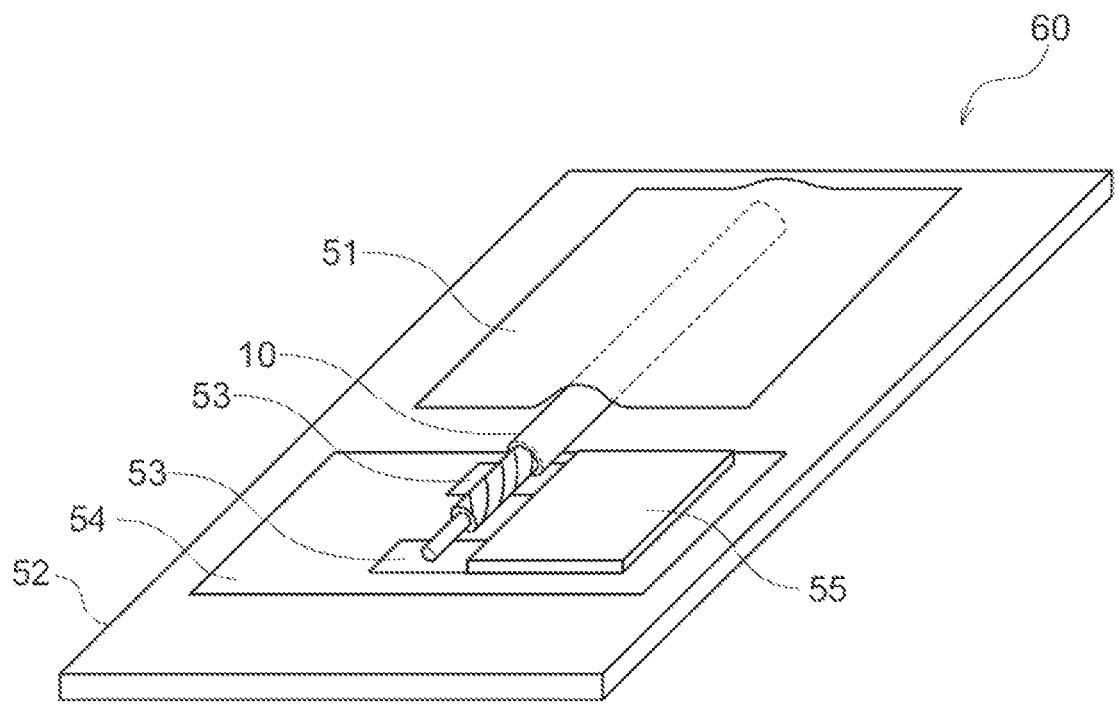
FIG. 7 illustrates an example of a piezoelectric substrate that is attached with a flat plate with an adhesive tape.
Figure 8:
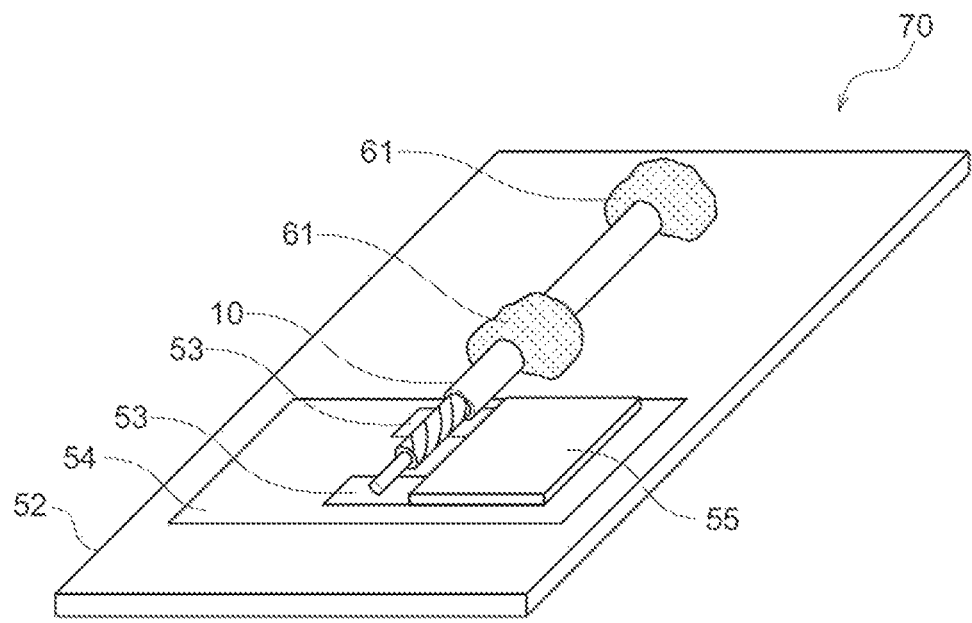
FIG. 8 illustrates an example of a piezoelectric substrate that is attached with a flat plate with an adhesive.

In a flat plate-equipped piezoelectric substrate 60 illustrated in FIG. 7, a part of the piezoelectric substrate 10 is attached to the flat plate 52 using the adhesive tape 51, an FPC (flexible printed circuit board) 54 is disposed on the flat plate 52, and copper foils 53 that are conductive with the piezoelectric substrate 10 are disposed on the FPC 54. The flat plate-equipped piezoelectric substrate 60 also includes a signal processing circuit unit 55, which detects and processes piezoelectric signals that are detected when a tensile force is applied to the piezoelectric substrate 10. A flat plate-equipped piezoelectric substrate 70, illustrated in FIG. 8, has the same configuration as the flat plate-equipped piezoelectric substrate 60, except that a part of the piezoelectric substrate 10 is attached to the flat plate 52 using the adhesive 61 instead of the adhesive tape 51.

An object to which the piezoelectric substrate is attached is not limited to a flat plate, and may be an object having a curved surface, such as an inside or outside of a housing for electronic circuits.

Figure 9:
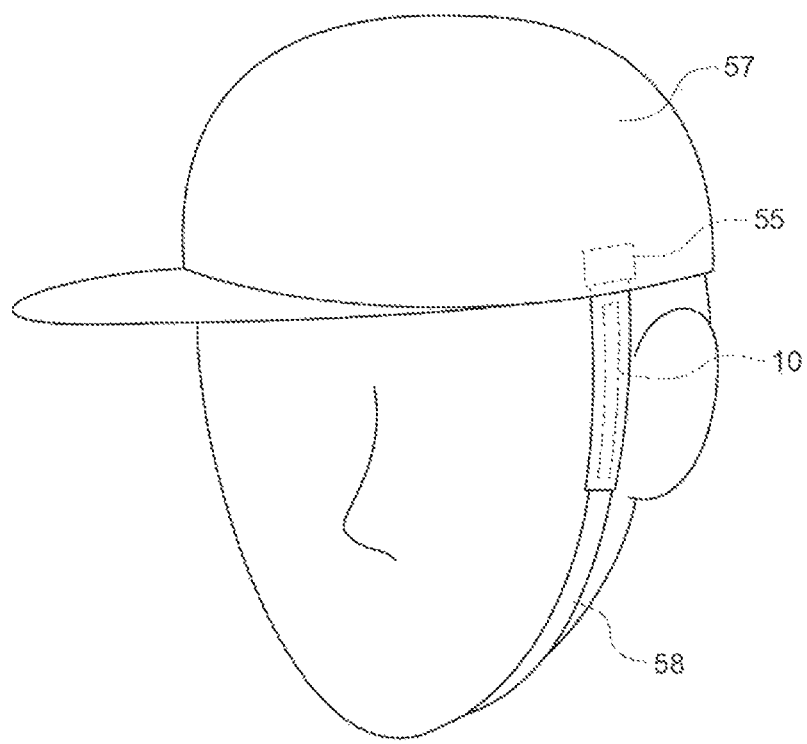
FIG. 9 is a schematic view illustrating a state in which a piezoelectric substrate forms a part of a chin strap.

As illustrated in FIG. 9, the piezoelectric substrate 10 may be disposed at a part of a chin strap 58 of a helmet (or a cap) 57 so as to detect, as a voltage signal, a change in the tension of the chin strap caused by movement of a jaw, such as chewing. This enables to detect and monitor the strength or the number of times of chewing and the like, as voltage signals.

<Applications of Piezoelectric Substrate>

The piezoelectric substrate of the present embodiment can be utilized in, for example, sensor applications (e.g., force sensors such as sitting sensors; pressure sensors; displacement sensors; deformation sensors; vibration sensors; supersonic sensors; biological sensors; acceleration sensors and impact sensors for various ball-game sporting equipments, such as rackets, golf clubs, and bats; touch/impact sensors of stuffed toys; bed watching sensors; and security sensors for glass and window frames); actuator applications (e.g., sheet transfer devices); energy harvesting applications (e.g., power generation wear and power generation shoes); and healthcare-related applications (e.g., wearable sensors in which the above-described sensors are provided in various clothing items, such as T-shirts, sportswear, spats, and socks; supporters; plaster casts; diapers; seats of infant push carts; wheelchair seats; medical incubator mats; shoes; shoe insoles; and watches).

The piezoelectric substrate of the present embodiment can be utilized in various articles, such as various clothing items (e.g., shirts, suits, blazers, blouses, coats, jackets, blousons, jumpers, vests, dresses, trousers, skirts, pants, underwear (e.g., slips, petticoats, camisoles, and brassieres), socks, gloves, Japanese clothes, obi materials, gold brocades, cool feeling clothes, neckties, handkerchiefs, mufflers, scarfs, stoles, and eye masks), supporters (e.g., neck supporters, shoulder supporters, chest supporters, abdominal supporters, waist supporters, arm supporters, leg supporters, elbow supporters, knee supporters, wrist supporters, and ankle supporters), footwear (e.g., sneakers, boots, sandals, pumps, mules, slippers, ballet shoes, and kung-fu shoes), insoles, towels, rucksacks, headgears (e.g., hats, caps, caskets, hunting caps, ten-gallon hats, flop hats, sun visors, and berets), cap straps, helmets, helmet chin straps, headscarf, belts, seat covers, sheets, floor cushions, cushions, quilts, quilt covers, blankets, pillows, pillow cases, sofas, chairs, desks, tables, seats, seating units, toilet seats, massage chairs, beds, bed pads, carpets, baskets, masks, dressing bandages, ropes, stuffed toys, various nets, bathtubs, wall materials, window materials, window frames, doors, door knobs, personal computers, computer mice, keyboards, printers, housings, robots, musical instruments, prosthetic arms, prosthetic legs, bicycles, skateboards, roller skates, rubber balls, shuttlecocks, handles, pedals, fishing rods, fishing floats, fishing reels, fishing rod holders, lures, switches, safes, fences, ATMs, grips, dials, bridges, buildings, structures, tunnels, chemical reaction vessels and pipes thereof, pneumatic instruments and pipes thereof, hydraulic instruments and pipes thereof, vapor pressure instruments and pipes thereof, motors, electromagnetic solenoids, and gasoline engines. In these applications, the piezoelectric substrate of the present embodiment is used as a sensor, an actuator, or an energy harvester.

The piezoelectric substrate can be applied to an object by, for example, stitching the piezoelectric substrate into the object, sandwiching the piezoelectric substrate between the objects, or attaching the piezoelectric substrate to the object with an adhesive.

For example, the piezoelectric substrate of the present embodiment can be suitably used in these applications as a piezoelectric woven fabric, a piezoelectric knitted fabric or a piezoelectric device, as described later.

Among the above-described applications, the piezoelectric substrate of the present embodiment is preferably utilized for a sensor application or an actuator application.

Specifically, the piezoelectric substrate of the present embodiment is preferably utilized by mounting the same on a force sensor or an actuator.

Further, the above-described piezoelectric substrate, piezoelectric woven fabric, piezoelectric knitted fabric and piezoelectric device can be utilized as a switching device, which can switch a field effect transistor (FET) by applying a voltage generated by a stress to the gate and the source of the FET to change its ON- and OFF in response to the stress.

The piezoelectric substrate of the present embodiment may be used in applications other than those described above.

Examples of the other applications include beddings for detecting rolling over; carpets for detecting movement; insoles for detecting movement; chest bands for detecting respiration; masks for detecting respiration; arm bands for detecting strain; leg bands for detecting strain; seats for detecting seating; and stuffed toys, stuffed toy-type social robots and the like that are capable of determining a state of contact. For example, a contact sensor provided in the stuffed toys or the like can determine whether the action of a user is rubbing, hitting, pulling or the like, by detecting a change in the pressure applied thereto.

In addition, the piezoelectric substrate of the present embodiment is particularly suitable in, for example, in-vehicle applications; applications for detecting gripping of an automobile steering wheel, utilizing a vibration/sound sensing system; applications for in-vehicle instrument operation system based on resonance spectrum, utilizing a vibration/sound sensing system; touch sensor applications for in-vehicle displays; vibrator applications; sensor applications for detecting getting caught in a door or a window; and vehicle vibration sensor applications.

The piezoelectric substrate of the present embodiment can be connected to a known extraction electrode. Examples of the extraction electrode include electrode components such as connectors and crimp terminals. An electrode component can be connected to the piezoelectric substrate by, for example, brazing such as soldering, or using an electroconductive bonding agent.

[Piezoelectric Woven Fabric]

The piezoelectric woven fabric of the present embodiment includes the above-described piezoelectric substrate.

The term "piezoelectric woven fabric" used herein refers to a woven fabric that exerts a piezoelectric effect upon application of an external stimulus (e.g., a physical force). The term "woven fabric" used herein generally refers to a fabric that is processed into a sheet form or a film form by interlacing yarns to form a woven structure.

The piezoelectric woven fabric of the present embodiment may have the piezoelectric substrate in any manner. For example, the piezoelectric woven fabric may have at least a part of at least one of the warp or the weft that is, or includes, a piezoelectric substrate.

In the case in which the piezoelectric woven includes a piezoelectric substrate in both of the warp and the weft, from the standpoint of improving the piezoelectric sensitivity and the piezoelectric output stability, it is preferred that the winding direction of the piezoelectric body included in the warp and the winding direction of the piezoelectric body included in the weft are different from each other, and that the chirality of the helical chiral polymer included in the warp and the chirality of the helical chiral polymer included in the weft are the same.

Alternatively, it is preferred that the winding direction of the piezoelectric body included in the warp and the winding direction of the piezoelectric body included in the weft are the same, and that the chirality of the helical chiral polymer included in the warp and the chirality of the helical chiral polymer included in the weft are different from each other.

The material of the yarns constituting the piezoelectric woven fabric is not particularly restricted. The yarns may be, for example, polymer-containing yarns. Examples of the polymer include common polymers, such as polyesters and polyolefins; and helical chiral polymers such as those described above.

The concept of the polymer-containing yarns also encompasses the piezoelectric substrate of the present embodiment.

The woven structure of the piezoelectric woven fabric of the present embodiment is not particularly restricted. Examples of the woven structure include basic structures, such as plain weave, twill weave, and satin weave.

The piezoelectric woven fabric of the present embodiment may be a woven fabric having a three-dimensional structure. The "woven fabric having a three-dimensional structure" used herein refers to a woven fabric that is produced in a steric manner by using yarns (warp and weft) in the thickness direction of a woven fabric, in addition to a two-dimensional structure. Examples of a woven fabric having a three-dimensional structure are described in, for example, Japanese National-Phase Publication (JP-A) No. 2001-513855.

The piezoelectric woven fabric may be utilized in various applications in which piezoelectric properties are required at least partially. Specific examples of the applications include various clothing items (e.g., shirts, suits, blazers, blouses, coats, jackets, blousons, jumpers, vests, dresses, trousers, skirts, pants, underwear (e.g., slips, petticoats, camisoles, and brassieres), socks, gloves, Japanese clothes, obi materials, gold brocades, cool feeling clothes, neckties, handkerchiefs, mufflers, scarfs, stoles, eye masks), tablecloths, footwear (e.g., sneakers, boots, sandals, pumps, mules, slippers, ballet shoes, and kung-fu shoes), towels, pouches, bags (e.g., tote bags, shoulder bags, handbags, pochettes, shopping bags, eco-bags, rucksacks, daypacks, sports bags, club bags, waist bags, waist pouches, secondary bags, clutch bags, vanity bags, accessory pouches, mother bags, party bags, and kimono bags), pouches/cases (e.g., cosmetic pouches, tissue cases, eyeglass cases, pen cases, book jackets, game pouches, key cases, and commuter pass cases), wallets, headgears (e.g., hats, caps, caskets, hunting caps, ten-gallon hats, flop hats, sun visors, and berets), helmets, headscarf, belts, aprons, ribbons, corsages, brooches, curtains, wall cloths, seat covers, sheets, quilts, quilt covers, blankets, pillows, pillow cases, sofas, beds, baskets, wrapping materials, room decorations, car accessories, artificial flowers, masks, bandages, ropes, nets, fishing nets, cement reinforcing materials, screen printing meshes, various filters (e.g., for cars and household appliances), various meshes, sheets (e.g., agricultural sheets and leisure sheets), civil engineering fabrics, construction fabrics, and filter cloths.

It is noted here that the items specifically exemplified above may be entirely constituted by the piezoelectric woven fabric of the present embodiment, or only those parts required to be piezoelectric may be constituted by the piezoelectric woven fabric of the present embodiment.

The piezoelectric woven fabric of the present embodiment is particularly suitable for wearable products that come into contact with the body.

[Piezoelectric Knitted Fabric]

The piezoelectric knitted fabric of the present embodiment includes the above-described piezoelectric substrate.

The term "piezoelectric knitted fabric" used herein refers to a knitted fabric that exerts a piezoelectric effect upon application of an external stimulus (e.g., a physical force). The term "knitted fabric" used herein generally refers to a fabric that includes a knitted structure formed by making loops with yarns.

The piezoelectric knitted fabric of the present embodiment may include the piezoelectric substrate in any manner. For example, the piezoelectric knitted fabric may have at least a part of at least one of the warp or the weft that is, or includes, a piezoelectric substrate.

The material of the yarns constituting the piezoelectric knitted fabric is not particularly restricted. The yarns may be, for example, polymer-containing yarns. Examples of the polymer include common polymers, such as polyesters and polyolefins; and helical chiral polymers such as those described above.

The concept of the polymer-containing yarns also encompasses the piezoelectric substrate of the present embodiment.

The structure of the piezoelectric knitted fabric of the present embodiment is not particularly restricted, and examples thereof include weft knitting and warp knitting. Examples of the weft knitting include plain knitting, rib knitting, double knitting, purl knitting, and circular knitting. Examples of the warp knitting include tricot knitting, atlas knitting, diamond knitting, and Milanese knitting.

The piezoelectric knitted fabric of the present embodiment may be a knitted fabric having a three-dimensional structure. The "knitted fabric having a three-dimensional structure" used herein refers to a knitted fabric that is produced in a steric manner by using yarns in the thickness direction of a knitted fabric, in addition to a two-dimensional structure.

The piezoelectric knitted fabric can be utilized in various applications in which piezoelectric properties is required at least partially. Specific examples of the applications include the applications for the piezoelectric woven fabric, as described above.

The piezoelectric knitted fabric is particularly suitably used for a wearable device,

[Piezoelectric Device]

The piezoelectric device of the present embodiment includes the piezoelectric substrate of the present embodiment.

The term "piezoelectric device" used herein generally refers to a device that exerts a piezoelectric effect upon application of an external stimulus (e.g., a physical force).

The piezoelectric device may have the piezoelectric substrate in any manner. For example, the piezoelectric device may have the piezoelectric substrate as the piezoelectric woven fabric or the piezoelectric knitted fabric, as described above.

The piezoelectric device may further have an outer conductor.

The piezoelectric device may have an outer conductor in any manner. For example, the piezoelectric device may include: a piezoelectric woven fabric or a piezoelectric knitted fabric, including a piezoelectric substrate, and an outer conductor that is disposed to face the main surface of the piezoelectric woven fabric or the piezoelectric knitted fabric.

When the piezoelectric device has an outer conductor, the outer conductor is preferably a ground conductor. The material of the ground conductor is not particularly restricted, and examples thereof include the materials for the outer conductor provided to the piezoelectric substrate, as described above.

As the outer conductor for the piezoelectric device, any commonly-used electrode material can be used as well. Examples of the electrode material include, in addition to metals (e.g., Al), alloys of Ag, Au, Cu or Ag—Pd, Ag pastes, Cu pastes, carbon blacks, ITOs (crystallized ITO and amorphous ITO), ZnO, IGZO, IZO (registered trademark), electroconductive polymers (polythiophene and PEDOT), Ag nanowires, carbon nanotubes, and graphene. The material of the outer conductor for the piezoelectric device may be the same as or different from that of the outer conductor used in the piezoelectric substrate.

The shape of the outer conductor included in the piezoelectric device is not particularly restricted, and it can be selected as appropriate in accordance with the intended purpose thereof.

The piezoelectric device of the present embodiment may include: the piezoelectric woven fabric or the piezoelectric knitted fabric, which includes the piezoelectric substrate; the outer conductor that is disposed at a position facing the main surface of the piezoelectric woven fabric or the piezoelectric knitted fabric; and an insulator that is disposed between the piezoelectric woven fabric or the piezoelectric knitted fabric and the outer conductor. By providing an insulator to the piezoelectric device, occurrence of short circuit between the conductor cord in the piezoelectric substrate and the outer conductor is likely to be suppressed.

The material of the insulator included in the piezoelectric device is not particularly restricted. Examples thereof include the same materials as those exemplified for the insulator arranged in the above-described piezoelectric substrate.

The shape of the insulator included in the piezoelectric device is not particularly restricted, and it can be selected as appropriate in accordance with the intended purpose thereof.

The piezoelectric device can be utilized in various applications in which piezoelectric properties are required at least partially. Specific examples of the applications include the applications described as the applications for the piezoelectric woven fabric.

The items utilizing the piezoelectric device may be formed totally from the piezoelectric device, or may have a portion formed of the piezoelectric device.

The piezoelectric device of the present embodiment is particularly suitable for wearable products.

[Force Sensor]

The force sensor of the present embodiment includes the piezoelectric substrate of the above-described embodiment. In the following, a specific embodiment of the force sensor including the piezoelectric substrate is described by referring to a drawing.

Figure 4:
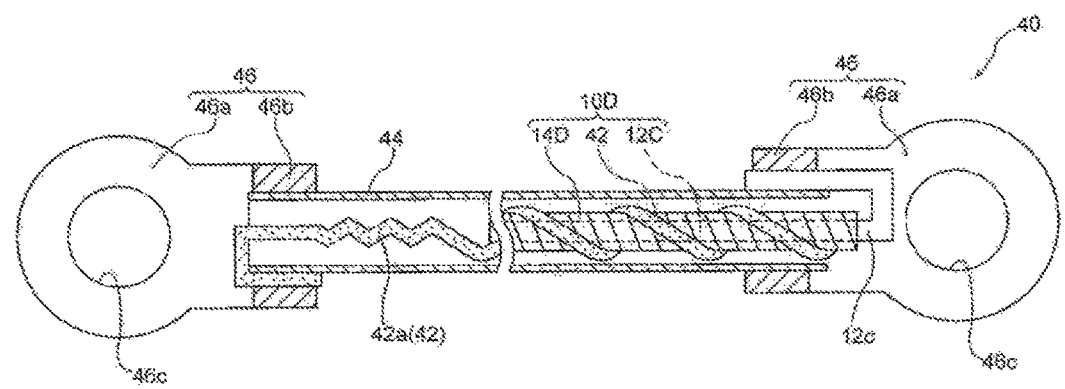
FIG. 4 is a conceptual plan view of a force sensor.

FIG. 4 is a conceptual cross-sectional view of the force sensor. A force sensor 40 includes: a rubber-based heat-shrinkable tube 44 having a cylindrical shape (hereinafter, also simply referred to as a "shrinkable tube") as a second insulator; a piezoelectric substrate 10D that is disposed inside the shrinkable tube 44; and a pair of crimp terminals (extraction electrodes) 46 that are disposed on both ends of the shrinkable tube 44. Each of the crimp terminals 46 has a main body 46a and a crimp portion 46b, and a through-hole 46c is formed at a center thereof. The piezoelectric substrate 10D includes: a conductor cord 12C that corresponds to an inner conductor; a piezoelectric body 14D that is disposed around the conductor cord 12C in a unidirectional and spiral manner; and an outer conductor 42 (ground conductor) that is disposed around the piezoelectric body 14D in a spiral manner, unidirectionally along the outer periphery of the piezoelectric body 14D.

In the piezoelectric substrate 10D, one of the ends of the conductor cord 12C (right-side end in FIG. 4) extends toward the outside of the shrinkable tube 44, and is electrically connected to the respective crimp terminals 46 at the crimp portion 46b. Meanwhile, the outer conductor 42, which is wound around the conductor cord 12 from one end to the other end, extends over the end (left-side end in FIG. 4) of the conductor cord 12C, and the extended portion forms a stress-relief section 42a inside the shrinkable tube 44.

The outer conductor 42 extends through the stress-relief section 42a to the outside (left-side end in FIG. 4) of the shrinkable tube 44, and is electrically connected to the respective crimp terminals 46 at the crimp portion 46b.

As illustrated in FIG. 4, the stress-relief section 42a is formed of the outer conductor 42 in a slack state. When a tension (stress) is applied to the force sensor 40, the outer conductor 42 forming the stress-relief section 42a is tensed, and excessive application of a force to the piezoelectric body 14D is suppressed.

The piezoelectric body 14D has an elongated flat-plate shape, and an aluminum-deposited films (not illustrated) is disposed as a functional layer on both sides of the piezoelectric body 14D. The crimp terminals 46 are connected to an external circuit or the like (not illustrated) that processes output signals from the force sensor 40.

In the embodiment illustrated in FIG. 4, the outer conductor 42 in a slack state is disposed as the stress relief section 42a; however, the embodiment of the invention is not restricted thereto, and a stress-relieving function may be imparted to the force sensor 40 by providing, by attaching with an adhesive or tying, a linear stress-relief section on at least one or both ends of the piezoelectric substrate 10D such that a tension can be transmitted.

In this case, the linear stress-relief section does not have any electrical connection function; however, as the electrical connection function, a voltage signal of a stress or a strain can be detected by connecting the conductor cord and the outer conductor from one end of the piezoelectric substrate to a coaxial cable or the like, independently of the stress-relief section.

The material or the configuration of the stress-relief section is not particularly restricted, and examples thereof include: cord-form materials, such as yarns, strings and tubes that are composed of a stretchable elastic material, such as a natural rubber, a silicone rubber or a urethane rubber; and springs formed of a metallic material such as phosphor bronze or a linear polymer.

By disposing a stress-relief section and an electrical connection part independently at different sites, the limitation on the amount of strain in the stress-relief section, which is attributed to the maximum elongation amount of the electrical connection part, is eliminated, and the maximum strain amount as a tension sensor can be increased.

In the example illustrated in FIG. 9, in which the piezoelectric substrate 10 is disposed in a part of the chin strap 58 of the helmet (or cap) 57, the chin strap 58 functions as the stress-relief section.

In the following, functions of the force sensor 40 of the present embodiment are described.

When a tension (stress) is applied to the force sensor 40, a tension is applied to the piezoelectric substrate 10D, and a shear force is applied to the helical chiral polymer included in the piezoelectric body 14D of the piezoelectric substrate 10D. This shear force causes polarization of the helical chiral polymer in the radial direction of the piezoelectric substrate 10D. The direction of the polarization is the radial direction of the piezoelectric substrate 10D. Consequently, a charge (electric field) that is proportional to the tension is generated, and the generated change is detected as a voltage signal (charge signal). The voltage signal is detected by an external circuit or the like (not illustrated) that is connected to the crimp terminals 46.

The force sensor 40 of the present embodiment includes the piezoelectric substrate 10D, having the same structure as the inner structure of a coaxial cable. Therefore, the force sensor 40 has excellent electromagnetic-shielding performance and noise resistance. In addition, since the structure is simple, the force sensor 40 can be utilized in a wearable sensor, for example.

The configuration of the force sensor is not restricted to that in which a charge (electric field) that is generated upon application of a tension to the piezoelectric substrate is extracted as a voltage signal, and may be that in which a charge (electric field) that is generated upon application of a torsion to the piezoelectric substrate is extracted as a voltage signal.

[Biological Information Acquisition Device]

The biological information acquisition device of the present embodiment includes the piezoelectric substrate of the above-described embodiment.

The piezoelectric substrate of the present embodiment, the piezoelectric woven fabric of the present embodiment, and the piezoelectric knitted fabric of the present embodiment are also preferably used are biological information acquisition devices.

In other words, the biological information acquisition device of the present embodiment includes the piezoelectric substrate of the present embodiment, the piezoelectric woven fabric of the present embodiment, or the piezoelectric knitted fabric of the present embodiment.

The biological information acquisition device of the present embodiment is a device that acquires biological information of a person or an animal (hereinafter, collectively referred to as a "test subject") by detecting a biological signal of the test subject by using the above-described piezoelectric substrate, the above-described piezoelectric woven fabric, or the above-described piezoelectric knitted fabric.

Examples of the biological signal include pulse wave (heart-rate), respiration, motion, cardiac action, and a body tremor.

The term "body tremor" used herein refers to a rhythmic involuntary movement of a body part (e.g., finger, hand, forearm, or upper limb).

The detection of the cardiac action also includes detection of an effect of a force exerted by the cardiac function of the body.

In other words, when the heart pumps blood to the aorta and the pulmonary artery, the body is subjected to a reaction force in the opposite direction of the blood flow. The strength and the direction of this reaction force vary depending on the functional stage of the heart. The reaction force is detected by sensing the cardiac actions on the outside of the body.

The biological information acquisition device is arranged in various articles, such as clothing items (e.g., shirts, suits, blazers, blouses, coats, jackets, blousons, jumper coats, vests, dresses, trousers, pants, underwear (e.g., slips, petticoats, camisoles, and brassieres), socks, gloves, Japanese clothes, obi materials, gold brocades, cool-feeling clothes, neckties, handkerchiefs, mufflers, scarfs, stoles, and eye masks), supporters (e.g., neck supporters, shoulder supporters, chest supporters, abdominal supporters, waist supporters, arm supporters, leg supporters, elbow supporters, knee supporters, wrist supporters, and ankle supporters), footwear (e.g., sneakers, boots, sandals, pumps, mules, slippers, ballet shoes, and kung-fu shoes), insoles, towels, rucksacks, headgears (e.g., hats, caps, caskets, hunting caps, ten-gallon hats, floppy hats, sun visors, and berets), helmets, helmet chin straps, headscarf, belts, seat covers, sheets, floor cushions, cushions, quilts, quilt covers, blankets, pillows, pillow cases, sofas, chairs, desks, tables, seats, seating units, toilet seats, massage chairs, beds, bed pads, carpets, baskets, masks, dressing bandages, ropes, various nets, bathtubs, floor materials, wall materials, personal computers, and computer mice.

The articles to be provided with the biological information acquisition device are preferably those articles that are subjected to the body weight of a test subject, such as footwear, insoles, sheets, floor cushions, cushions, quilts, quilt covers, pillows, pillow cases, sofas, chairs, seats, seating units, toilet seats, beds, carpets, bathtubs, and floor materials. More specifically, the articles are preferably, for example, seats, seating sections, wheels, infant-fall stoppers and the like of infant push carts; seats, seating sections and the like of wheelchairs; and mats of medical incubators.

In the following, an exemplary action of the biological information acquisition device is described.

The biological information acquisition device is disposed at, for example, a bed or a seating surface of a chair. A test subject lies, sits or stands on the biological information acquisition device. In this state, when a tension is applied to the piezoelectric substrate, piezoelectric woven fabric or piezoelectric knitted fabric of the biological information acquisition device, due to a biological signal generated by the test subject (e.g., body motion, periodic vibration (e.g., pulse or respiration), or a change in the heart rate caused by human emotion, such as feeling "cute" or "scary"), polarization occurs in the helical chiral polymer included in the piezoelectric substrate, piezoelectric woven fabric or piezoelectric knitted fabric. As a result, an electric potential that is proportional to the tension is generated. This electric potential changes over time in accordance with the biological signal generated by the test subject. For example, when the biological signal generated by the test subject is periodic oscillation such as pulse or respiration, the electric potential generated in the piezoelectric substrate, piezoelectric woven fabric or piezoelectric knitted fabric also changes in a periodical manner.

The time-dependent changes in the electric potential generated in association with the application of a tension to the piezoelectric substrate, piezoelectric woven fabric or piezoelectric knitted fabric are acquired as voltage signals by a measurement module. The time-dependent changes in the electric potential (piezoelectric signals) form a composite wave of plural biological signals (pulse wave signals (heart-rate signals), respiration signals, and body motion signals). The composite wave is separated into signals of respective frequencies based on Fourier transformation, and separated signals are generated. The separated signals are subjected to inverse-Fourier-transformation, thereby obtaining biological signals corresponding to the respective separated signals.

EXAMPLES

In the following, the invention is described more concretely by referring to the Examples. However, the invention is not restricted to the following examples as long as they do not depart from the gist of the invention.

<Preparation of Piezoelectric Body>

With respect to 100 parts by mass of a polylactic acid (manufactured by NatureWorks LLC, product name: INGEO™ BIOPOLYMER, brand: 4032D) as a helical chiral polymer, 1.0 part by mass of a stabilizer was added, and the resultant was dry-blended to prepare a raw material.

The stabilizer used in the preparation is a mixture of STABAXOL P400, manufactured by Rhein Chemie Rheinau GmbH (10 parts by mass), STABAXOL I, manufactured by Rhein Chemie Rheinau GmbH (70 parts by mass) and CARBODILITE LA-1, manufactured by Nisshinbo Chemical Inc. (20 parts by mass).

The raw material was placed in a hopper of an extrusion molding machine, extruded from a T-die at 210° C., and then brought into contact with a 50° C. casting roll for 0.3 minutes, whereby a 150 μm-thick pre-crystallized sheet was formed (pre-crystallization process). The crystallinity of the pre-crystallized sheet was 6%.

The pre-crystallized sheet was uniaxially stretched in the MD direction to a stretching ratio of 3.5 times, by initiating the stretching at a rate of 10 m/min in a roll-to-roll manner while heating the pre-crystallized sheet to 70° C. (stretching process). The thickness of the obtained film was 49.2 µm.

Subsequently, the uniaxially stretched film was annealed by allowing the film to contact with a roll heated to 145° C. for 15 seconds in a roll-to-roll manner, and the film was rapidly cooled to obtain a piezoelectric film (annealing process).

Thereafter, the piezoelectric film was slit with a slitting machine, along a direction that is substantially parallel to a direction of stretching. A ribbon-form piezoelectric body (slit ribbon) having a width of 0.39 mm and a thickness of 50 µm was obtained. The thus obtained piezoelectric body had a rectangular cross-sectional shape.

(3) Measurement of Physical Properties of Piezoelectric Body

The following physical properties of the ribbon-form piezoelectric body obtained in the above-descried manner were measured. The results are shown in Table 1.

A sample (piezoelectric body) was fixed on a holder of a wide-angle X-ray diffractometer (RINT 2550, manufactured by Rigaku Corporation, attached equipment: rotary sample table, X-ray source: CuKα, output: 40 kV, 370 mA, detector: scintillation counter), and the azimuthal distribution intensity of a crystal plane peak [(110) plane/(200) plane] was measured.

In the thus obtained azimuthal distribution curve (X-ray interferogram), the crystallinity was 45%. The orientation degree F. (C-axis orientation degree) of polylactic acid, which was calculated from a half width (α) of a peak based on the following equation, was 0.97.

Orientation degree (F.)=(180°−α)/180°

In the equation, α represents a half width of a peak derived from orientation.

Example 1

<Production of Piezoelectric Substrate>

A piezoelectric substrate having a configuration similar to the piezoelectric substrate 10 illustrated in FIG. 1, further provided with a copper foil ribbon as an outer conductor (ground conductor), was produced by the following method.

As a core material of a conductor cord, a polyester monofilament manufactured by GOSEN Co., Ltd. (SUPER HONTERON GP, wire outer diameter; 0.128 mm, length: 250 mm) was used. A conductor cord was prepared by winding a rolled copper foil (0.3 mm in width×0.018 mm in thickness) around the core material in a spiral manner (S-winding), such that the core material was not exposed, thereby forming an inner conductor (the number of layers=1). The term "S-twist" used herein refers to a state that, when viewed from one end of the axial direction of the conductor cord (right-end side in the case of FIG. 1), the ribbon-form piezoelectric body is wound in a left-handed manner (counterclockwise) from the front side toward the back side of the conductor cord. The respective ends of the conductor cord were provided with crimp terminals as an electrical connector and a mechanical connector.

The bending rigidity per unit length B of the conductor cord was measured using a pure bending tester (KES-FB2, manufactured by Kato Tech Co., Ltd.). The measurement was performed at a fiber measuring length (d) of 0.12 mm. The bending rigidity per unit length B was $10.2 \times 10^{-4}$ [N·m²/m].

Subsequently, a piezoelectric substrate was obtained by winding the piezoelectric body obtained in the above process around the conductor cord, in a left-handed spiral manner such that the surface of the conductor cord was not exposed. The piezoelectric body was disposed at an angle of approximately 45° with respect to the axial direction of the conductor cord (at a spiral angle of 45°).

Then, as an outer conductor, a rolled copper foil ribbon of 0.32 mm in width and 0.018 mm in thickness was prepared. The copper foil ribbon was wound around the piezoelectric substrate in the S-twist direction, in a similar manner to the winding of the piezoelectric body, without a gap such that the surface of the piezoelectric substrate was not exposed.

<Evaluation>

Using the piezoelectric substrate obtained in Example 1, the amount of charge generated when a tensile force was applied to the piezoelectric substrate (amount of generated charge) was measured, and the amount of generated charge per unit tensile force was calculated therefrom. The result is shown in Table 1.

(Amount of Generated Charge Per Unit Tensile Force)

As a sample, the piezoelectric substrate of Example 1 was chucked to a tensile tester (TENSILON RTG1250 manufactured by A&D Co., Ltd.) at a chuck distance of 200 mm.

Subsequently, a tension in a triangular wave form was periodically and repeatedly applied to the sample, in a stress range of from 1.5 N to 4.5 N at a frequency of 0.2 Hz, and the amount of charge generated on both sides of the sample in this process was measured using an electrometer (617, manufactured by Keithley Instruments, Inc.) The amount of generated charge per unit tensile force was calculated from the slope of a correlation straight line of a scatter diagram with the Y axis indicating the measured amount of generated charge Q [C] and the X-axis indicating the tensile force F [N] of the sample.

(Evaluation of Shape)

Using a stereoscopic microscope (VHX5000, manufactured by Keyence Corporation), the piezoelectric substrate was observed from a direction perpendicular to the axial direction of the conductor cord to determine whether or not the observed shape satisfied the condition of Formula (b): $D_{max} < t_{pmin}$. The result is shown in Table 1, where "TRUE" indicates that the condition is satisfied, and "FALSE" indicates that the condition is not satisfied.

(Evaluation of Shape Retainability)

In order to evaluate the resistance to plastic deformation of the piezoelectric substrate, the piezoelectric substrate was wound twice around a cylinder made of Bakelite with a diameter of 1 cm. Whether or not the piezoelectric substrate maintained its circular shape after removing the cylinder was evaluated by visual observation.

The result is shown in Table 1, where "NO" indicates that the piezoelectric substrate maintained its circular shape over time, i.e., the piezoelectric substrate does not have shape retainability, and "YES" indicates that the piezoelectric substrate springs back to the original state, i.e., the piezoelectric substrate has shape retainability.

(Evaluation of Conduction Failure Rate)

The piezoelectric substrate of Example 1 was cut into 20 samples each having a length of 20 cm. The conduction between the conductor cord and the outer conductor was measured using an LCR meter (HP4284A). In the measurement, measuring terminals were connected to the conductor cord and the outer conductor, and the resistance between the conductors was measured. A sample showing a resistance value of less than 1 MΩ was deemed that short circuit was caused, and the samples were evaluated as "A", indicating that short circuit was not caused, or "B", indicating that short circuit was caused.

The ratio of the number of samples evaluated as B out of 20 samples is shown in Table 1 as the conduction failure rate.

Example 2

The same operations as in Example 1 were performed, except that the thickness of the core material was changed to 0.205 mm and the width of the piezoelectric body was changed to 0.67 mm. The results are shown in Table 1.

Example 3

The same operations as in Example 1 were performed, except that the thickness of the core material was changed to 0.285 mm, the width of the piezoelectric body was changed to 0.67 mm, and the width of the outer conductor was changed to 0.6 mm. The results are shown in Table 1.

Example 4

The same operations as in Example 2 were performed, except that the core material was changed to a fluorocarbon fiber (TOYOFLON SUPER HARD L, manufactured by Toray Industries, Inc.; outer diameter: 0.205 mm, length: 200 mm). The results are shown in Table 1.

Example 5

The same operations as in Example 4 were performed, except that the thickness of the core material was changed to 0.285 mm and the width of the outer conductor was changed to 0.6 mm. The results are shown in Table 1.

Example 6

The same operations as in Example 2 were performed, except that the core material was changed to a nylon fiber (SILVER SCALE, manufactured by Toray Industries, Inc.; outer diameter: 0.205 mm, length: 200 mm). The results are shown in Table 1.

Example 7

The same operations as in Example 6 were performed, except that the thickness of the core material was changed to 0.285 mm and the width of the outer conductor was changed to 0.6 mm. The results are shown in Table 1.

Example 8

The same operations as in Example 1 were performed, except that the core material was changed to a polyethylene fiber having high shape retainability (TEKNOROTE W1000, manufactured by Mitsui Chemicals, Inc.; outer diameter: 0.36 mm, length: 200 mm), the width of the piezoelectric body was changed to 0.67 mm, the direction of winding of the inner conductor and the outer conductor was changed to the Z-twist direction, the number of the layers of the inner conductor was changed to 2, and the width of the outer conductor was changed to 0.3 mm. The results are shown in Table 1.

Example 9

The same operations as in Example 1 were performed, except that the core material was changed to a multifilament composed of a filament yarn of a para-aramid resin (TECHNORA, manufactured by Teijin Ltd.; fineness: 220 dtex× single yarn, untwisted, length: 200 mm), the thickness of the core material was changed to 0.2 mm, the width of the piezoelectric body was changed to 0.67 mm, the direction of winding of the inner conductor and the outer conductor was changed to the Z-twist direction, the number of the layers of the inner conductor was changed to 2, and the width of the outer conductor was changed to 0.3 mm. The results are shown in Table 1.

Example 10

The same operations as in Example 1 were performed, except that the core material was changed to a multifilament composed of filament yarns of a polyester resin (#50 manufactured by GOSEN Ltd. triple-twisted, length: 200 mm), the thickness of the core material was changed to 0.3 mm, the width of the piezoelectric body was changed to 0.67 mm, the direction of winding of the inner conductor and the outer conductor was changed to the Z-twist direction, the number of the layers of the inner conductor was changed to 2, and the width of the outer conductor was changed to 0.3 mm. The results are shown in Table 1.

Example 11

The same operations as in Example 1 were performed, except that the core material was changed to a multifilament composed of filament yarns of a polyphenylene sulfide (PPS) resin (manufactured by KB Seiren, Ltd.; fineness: 110 dtex, double-twisted, length: 200 mm), the thickness of the core material was changed to 0.3 mm, the width of the piezoelectric body was changed to 0.67 mm, the direction of winding of the inner conductor and the outer conductor was changed to the Z-twist direction, the number of the layers of the inner conductor was changed to 2, and the width of the outer conductor was changed to 0.3 mm. The results are shown in Table 1.

Example 12

The same operations as in Example 1 were performed, except that the core material was changed to a multifilament composed of filament yarns of a PPS resin (manufactured by KB Seiren, Ltd.; fineness: 70 dtex, triple-twisted, length: 200 mm), the thickness of the core material was changed to 0.3 mm, the width of the piezoelectric body was changed to 0.67 mm, the direction of winding of the inner conductor and the outer conductor was changed to the Z-twist direction, the number of the layers of the inner conductor was changed to 2, and the width of the outer conductor was changed to 0.3 mm. The results are shown in Table 1.

Comparative Example 1

The same operations as in Example 1 were performed, except that the core material was changed to a multifilament composed of spun yarns of a meta-aramid resin (CONEX, manufactured by Teijin Ltd.; #40, double-twisted, length: 200 mm), the thickness of the core material was changed to 0.36 mm, the width of the piezoelectric body was changed to 0.67 mm, the direction of winding of the inner conductor and the outer conductor was changed to the Z-twist direction, the number of the layers of the inner conductor was changed to 2, and the width of the outer conductor was changed to 0.3 mm. The results are shown in Table 1.

The bending rigidity per unit length B of the conductor cord was measured using a pure bending tester (KES-FB2, manufactured by Kato Tech Co., Ltd.). The measurement was performed at a fiber measuring length (d) of 0.3 mm. As a result, the value of the bending rigidity per unit length B was $3.27 \times 10^{-4}$ [N·m²/m].

TABLE 1

| | Core material | | | | Sensitivity | | Conduction failure rate | Shape |
|---|---|---|---|---|---|---|---|---|
| | Form | Material | Filament | Twisting | Thickness | (pC/N · mm) | $\Delta D_{max} < t_{pmin}$ | (%) | retainability |
| Example 1 | Monofilament | Polyester | Monofilament | none | 0.128 mm | 9.85 | TRUE | 0 | NO |
| Example 2 | Monofilament | Polyester | Monofilament | none | 0.205 mm | 3.70 | TRUE | 0 | NO |
| Example 3 | Monofilament | Polyester | Monofilament | none | 0.285 mm | 0.56 | TRUE | 0 | NO |
| Example 4 | Monofilament | Fluorocarbon | Monofilament | none | 0.205 mm | 3.11 | TRUE | 0 | NO |
| Example 5 | Monofilament | Fluorocarbon | Monofilament | none | 0.285 mm | 0.53 | TRUE | 0 | NO |
| Example 6 | Monofilament | Nylon | Monofilament | none | 0.205 mm | 1.60 | TRUE | 0 | NO |
| Example 7 | Monofilament | Nylon | Monofilament | none | 0.285 mm | 0.37 | TRUE | 0 | NO |
| Example 8 | Monofilament | Polyethylene | Monofilament | none | 0.36 mm | 2.75 | TRUE | 0 | YES |
| Example 9 | Multifilament | para-aramid | Multifilament (filament yarn) | none | 220 dtex | 2.45 | TRUE | 0 | NO |
| Example 10 | Multifilament | Polyester | Multifilament (filament yarn) | present | #50, 3-twisted | 2.45 | TRUE | 0 | NO |
| Example 11 | Multifilament | PPS | Multifilament (filament yarn) | present | 110 dtex, 2-twisted | 2.45 | TRUE | 0 | NO |
| Example 12 | Multifilament | PPS | Multifilament (filament yarn) | present | 70 dtex, 3-twisted | 2.45 | TRUE | 0 | NO |
| Comparative Example 1 | Multifilament | meta-aramid | Multifilament (spun yarn) | present | #40, 2-twisted | not measurable | FALSE | 15 | NO |

As shown in Table 1, the piezoelectric substrates of the Examples, in which the condition of Formula (b) was satisfied, had a large amount of generated charge per unit tensile force and exhibited favorable piezoelectric sensitivity. In addition, all of the piezoelectric substrates of the Examples had a conduction failure rate of 0%. In the piezoelectric substrate of Comparative Example 1, that does not satisfy the condition of Formula (b), the amount of generated charge per unit tensile force was not measurable because short circuit of a charge generated upon application of a tension was caused at conduction sites locally formed between the inner conductor and the outer conductor. This piezoelectric substrate also had a higher conduction failure rate as compared to the Examples.

The disclosure of Japanese Patent Application No. 2017-083942 is hereby incorporated by reference in its entirety.

All the documents, patent applications and technical standards that are described in the present specification are hereby incorporated by reference to the same extent as if each individual document, patent application or technical standard is concretely and individually described to be incorporated by reference.

The invention claimed is:

1. A piezoelectric substrate, comprising:
   a conductor cord that has a core material and a conductor disposed around the core material; and
   an elongated piezoelectric body that is disposed around the conductor cord in a spiral manner, unidirectionally along an axial direction of the conductor cord, wherein:
   the piezoelectric body comprises an optically active helical chiral polymer,
   a lengthwise direction of the piezoelectric body and a main orientation direction of the helical chiral polymer in the piezoelectric body are substantially parallel to each other,
   the piezoelectric body has an orientation degree F. of from 0.5 to less than 1.0, as determined by X-ray diffractometry and Formula (a): $F=(180°-\alpha)/180°$, wherein $\alpha$ represents a half width of a peak derived from orientation, and
   when the conductor cord is viewed from a direction perpendicular to an axial direction of the conductor cord, the conductor cord satisfies Formula (b): $\Delta D_{max} < t_{pmin}$, wherein $\Delta D_{max}$ is a maximum value of a difference in height between a division A that is selected from plural divisions and a division B that is adjacent to the division A, and $t_{pmin}$ is a minimum thickness of the piezoelectric body.

2. The piezoelectric substrate according to claim 1, wherein the conductor is disposed around the core material in a spiral manner, unidirectionally along an axial direction of the core material.

3. The piezoelectric substrate according to claim 1, wherein the core material is a monofilament.

4. The piezoelectric substrate according to claim 1, wherein the conductor is an inner conductor and the piezoelectric body is disposed around the inner conductor in a spiral manner, unidirectionally along an outer periphery of the inner conductor.

5. The piezoelectric substrate according to claim 1, further comprising an insulator that is disposed at an outer periphery of the piezoelectric substrate.

6. The piezoelectric substrate according to claim 1, further comprising an insulator that is disposed between the conductor cord and the piezoelectric body.

7. The piezoelectric substrate according to claim 1, wherein the piezoelectric body is wound around the conductor cord at an angle of from 15° to 75° with respect to the axial direction of the conductor cord.

8. The piezoelectric substrate according to claim 1, wherein the piezoelectric body has an elongated flat plate shape.

9. The piezoelectric substrate according to claim 8, wherein the piezoelectric body having the elongated flat plate shape has a thickness of from 0.001 mm to 0.2 mm and a width of from 0.1 mm to 30 mm, and has a ratio of width to thickness of 2 or greater.

10. The piezoelectric substrate according to claim 1, wherein the piezoelectric body comprises a stabilizer in an amount of from 0.01 parts by mass to 10 parts by mass with respect to 100 parts by mass of the helical chiral polymer, the stabilizer having at least one functional group selected from the group consisting of a carbodiimide group, an epoxy group and an isocyanate group, and having a weight-average molecular weight of from 200 to 60,000.

11. The piezoelectric substrate according to claim 1, further comprising a functional layer.

12. The piezoelectric substrate according to claim 11, wherein the functional layer is at least one selected from the group consisting of an adhesion promoting layer, a hard coat layer, an antistatic layer, an anti-blocking layer, a protective layer, and an electrode layer.

13. The piezoelectric substrate according to claim 11, wherein the functional layer comprises an electrode layer.

14. The piezoelectric substrate according to claim 13, wherein the piezoelectric body and the functional layer are configured as a laminate, and at least one surface layer of the laminate is the electrode layer.

15. The piezoelectric substrate according to claim 1, further comprising an adhesive layer between the conductor cord and the piezoelectric body.

16. The piezoelectric substrate according to claim 1, wherein the helical chiral polymer in the piezoelectric body is a polylactic acid polymer that has a main chain including a structural unit represented by following Formula (1):

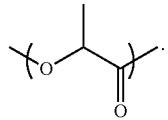

(1)

17. The piezoelectric substrate according to claim 1, further comprising an outer conductor disposed at an outer periphery of the piezoelectric substrate.

18. The piezoelectric substrate according to claim 17, further comprising an insulator disposed at an outer periphery of the outer conductor.

19. A force sensor comprising the piezoelectric substrate according to claim 1.

20. An actuator comprising the piezoelectric substrate according to claim 1.

\* \* \* \* \*